(12) United States Patent
Aramaki et al.

(10) Patent No.: US 6,298,022 B1
(45) Date of Patent: Oct. 2, 2001

(54) REPRODUCTION APPARATUS, RECORDING AND REPRODUCTION SYSTEM, REPRODUCTION METHOD, AND RECORDING AND REPRODUCTION METHOD

(75) Inventors: Junichi Aramaki, Chiba; Akira Ohba, Tokyo, both of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/520,116

(22) Filed: Mar. 6, 2000

(30) Foreign Application Priority Data

Mar. 19, 1999 (JP) .................................................. 11-076599

(51) Int. Cl.$^7$ ........................................................ G11B 7/00
(52) U.S. Cl. .................... 369/47.11; 369/53.1; 369/53.21
(58) Field of Search ................................ 369/47.1, 47.11, 369/47.12, 47.13, 47.15, 47.21, 47.35, 53.1, 53.27, 53.21, 53.31, 53.41, 59.1, 59.14, 84, 53.2

(56) References Cited

U.S. PATENT DOCUMENTS 5,587,978    12/1996    Endo et al. ............................. 369/32
5,805,551  *  9/1998    Oshima et al. ............... 369/53.21 X

FOREIGN PATENT DOCUMENTS 0 297 539 A2    1/1989    (EP) .
0 813 194 A2    6/1996    (EP) .

* cited by examiner

Primary Examiner—Muhammad Edun
(74) Attorney, Agent, or Firm—Oblon, Spivak, McClelland, Maier & Neustadt, P.C.

(57) ABSTRACT

A reproduction apparatus for reproducing a program recorded on a recording medium by which use of a high speed dubbing function by a user exceeding a range of personal use can be suppressed to achieve protection of the copyright is disclosed. The reproduction apparatus includes a reproduction means for reproducing a program recorded on a recording medium, a time counting means for starting time counting in response to an operation of the reproduction means, a detection means for detecting information for identification of the recording medium or the program, a memory for storing the detected identification information corresponding to the time counting means, a comparison means for comparing the stored identification information and the detected identification information, and a control means for inhibiting, when the comparison means discriminates that the stored identification information and the detected identification information coincide with each other, the reproduction by the reproduction means of the program corresponding to the identification information until the time counting of the time counting means corresponding to the identification information reaches a predetermined time.

26 Claims, 16 Drawing Sheets

FIG. 1

FRAME STRUCTURE

| SYNCHRO-NIZING | SUB CODING | DATA | PARITY | DATA | PARITY |
|---|---|---|---|---|---|
| 24 | 14 | | | | |

588 BITS

FIG. 2

| FRAME | SUB CODING |
|---|---|
| 98n+1 | SYNCHRONIZING PATTERN (S0) |
| 98n+2 | SYNCHRONIZING PATTERN (S1) |
| 98n+3 | P1 Q1 R1 S1 T1 U1 V1 W1 |
| 98n+4 | P2 Q2 R2 S2 T2 U2 V2 W2 |
| ⋮ | ⋮ |
| 98n+97 | P95 Q95 R95 S95 T95 U95 V95 W95 |
| 98n+98 | P96 Q96 R96 S96 T96 U96 V96 W96 |
| 98(n+1)+1 | |

FIG. 4

| Character | Binary | Octal |
|---|---|---|
| 0 | 000000 | 00 |
| 1 | 000001 | 01 |
| 2 | 000010 | 02 |
| 3 | 000011 | 03 |
| 4 | 000100 | 04 |
| 5 | 000101 | 05 |
| 6 | 000110 | 06 |
| 7 | 000111 | 07 |
| 8 | 001000 | 10 |
| 9 | 001001 | 11 |
| A | 010001 | 21 |
| B | 010010 | 22 |
| C | 010011 | 23 |
| D | 010100 | 24 |
| E | 010101 | 25 |
| F | 010110 | 26 |
| G | 010111 | 27 |
| H | 011000 | 30 |
| I | 011001 | 31 |
| J | 011010 | 32 |
| K | 011011 | 33 |
| L | 011100 | 34 |
| M | 011101 | 35 |
| N | 011110 | 36 |
| O | 011111 | 37 |
| P | 100000 | 40 |
| Q | 100001 | 41 |
| R | 100010 | 42 |
| S | 100011 | 43 |
| T | 100100 | 44 |
| U | 100101 | 45 |
| V | 100110 | 46 |
| W | 100111 | 47 |
| X | 101000 | 50 |
| Y | 101001 | 51 |
| Z | 101010 | 52 |

FIG. 6

SUB CODE BY U BITS

| SUB CODE SYNC WORD | | | | | | | | | | | | | |
|---|---|---|---|---|---|---|---|---|---|---|---|---|---|
| 1 | 2 | 3 | 4 | 5 | 6 | 7 | 8 | 9 | 10 | 11 | 12 | |
| 0 | 0 | 0 | 0 | 0 | 0 | 0 | 0 | 0 | 0 | 0 | 0 | 0TH FRAME |
| 0 | 0 | 0 | 0 | 0 | 0 | 0 | 0 | 0 | 0 | 0 | 0 | 1ST FRAME |
| 1 | Q1 | R1 | S1 | T1 | U1 | V1 | W1 | 0 | 0 | 0 | 0 | 2ND FRAME |
| 1 | Q2 | R2 | S2 | T2 | U2 | V2 | W2 | 0 | 0 | 0 | 0 | 3RD FRAME |
| . | . | . | . | . | . | . | . | . | . | . | . | . |
| 1 | Q96 | R96 | S96 | T96 | U96 | V96 | W96 | 0 | 0 | 0 | 0 | 97TH FRAME |

FIG. 7

CHANNEL STATUS BY C BITS

| BIT | 0 | 1 | 2 | 3 | 4 | 5 | 6 | 7 | 8 | 9 | 10 | 11 | 12 | 13 | 14 | 15 | |
|---|---|---|---|---|---|---|---|---|---|---|---|---|---|---|---|---|---|
| 0 | CONTROL | | | | | | MODE (0 0) | | | | | | | | | | |
| 16 | NUMBER OF SOURCE | | | | NUMBER OF CHANNEL | | | | SAMPLING FREQUENCY | | | | CATEGORY CODE CC | | | ACCURACY OF SAMPLING FREQUENCY | ← 1 WORD |
| 32 | BIT 32 TO BIT 191 NOT USED | | | | | | | | | | | | | | | | |
| ... | | | | | | | | | | | | | | | | | |
| 176 | | | | | | | | | | | | | | | | | |

FIG. 10

| | 16bits | | 16bits | | |
|---|---|---|---|---|---|
| | MSB      LSB | MSB      LSB | MSB      LSB | MSB      LSB | |
| HEADER | 00000000 | 11111111 | 11111111 | 11111111 | 0 |
| | 11111111 | 11111111 | 11111111 | 11111111 | 1 |
| | 11111111 | 11111111 | 11111111 | 00000000 | 2 |
| | Cluster H | Cluster L | Sector | 00000010 | 3 |
| | 00000000 | 00000000 | 00000000 | 00000000 | 4 |
| | 00000000 | 00000000 | 00000000 | 00000000 | 5 |
| | 00000000 | 00000000 | 00000000 | 00000000 | 6 |
| | Maker code | Model code | First TNO | Last TNO | 7 |
| | 00000000 | 00000000 | 00000000 | Used Secters | 8 |
| | 00000000 | 00000000 | 00000000 | 00000000 | 9 |
| | 00000000 | 00000000 | 00000000 | Disc Serial No | 10 |
| CORRESPOND-ENCE TABLE INDICATION DATA SECTION | DISC | ID | P-DFA | P-EMPTY | 11 |
| | P-FRA | P-TNO1 | P-TNO2 | P-TNO3 | 12 |
| | P-TNO4 | P-TNO5 | P-TNO6 | P-TNO7 | 13 |
| | P-TNO248 | P-TNO249 | P-TNO250 | P-TNO251 | 74 |
| | P-TNO252 | P-TNO253 | P-TNO254 | P-TNO255 | 75 |
| | 00000000 | 00000000 | 00000000 | 00000000 | 76 |
| | 00000000 | 00000000 | 00000000 | 00000000 | 77 |
| MANAGE-MENT TABLE SECTION (255 SLOTS) | (01h) START ADDRESS | | | TRACK MODE | 78 |
| | END ADDRESS | | | LINK INFORMATION | 79 |
| | (02h) START ADDRESS | | | TRACK MODE | 80 |
| | END ADDRESS | | | LINK INFORMATION | 81 |
| | (03h) START ADDRESS | | | TRACK MODE | 82 |
| | END ADDRESS | | | LINK INFORMATION | 83 |
| | (FCh) START ADDRESS | | | TRACK MODE | 580 |
| | END ADDRESS | | | LINK INFORMATION | 581 |
| | (FDh) START ADDRESS | | | TRACK MODE | 582 |
| | END ADDRESS | | | LINK INFORMATION | 583 |
| | (FEh) START ADDRESS | | | TRACK MODE | 584 |
| | END ADDRESS | | | LINK INFORMATION | 585 |
| | (FFh) START ADDRESS | | | TRACK MODE | 586 |
| | END ADDRESS | | | LINK INFORMATION | 587 |

U-TOC SECTOR 0

FIG. 12

| | 16bits | | 16bits | | |
|---|---|---|---|---|---|
| | MSB   LSB | MSB   LSB | MSB   LSB | MSB   LSB | |
| HEADER { | 00000000 | 11111111 | 11111111 | 11111111 | 0 |
| | 11111111 | 11111111 | 11111111 | 11111111 | 1 |
| | 11111111 | 11111111 | 11111111 | 00000000 | 2 |
| | Cluster H | Cluster L | Sector | 00000010 | 3 |
| | 00000000 | 00000000 | 00000000 | 00000000 | 4 |
| | 00000000 | 00000000 | 00000000 | 00000000 | 5 |
| | 00000000 | 00000000 | 00000000 | 00000000 | 6 |
| | 00000000 | 00000000 | 00000000 | 00000000 | 7 |
| | 00000000 | 00000000 | 00000000 | 00000000 | 8 |
| | 00000000 | 00000000 | 00000000 | 00000000 | 9 |
| | 00000000 | 00000000 | 00000000 | 00000000 | 10 |
| CORRESPOND-ENCE TABLE INDICATION DATA SECTION | 00000000 | 00000000 | 00000000 | P-EMPTY | 11 |
| | 00000000 | P-TNA1 | P-TNA2 | P-TNA3 | 12 |
| | P-TNA4 | P-TNA5 | P-TNA6 | P-TNA7 | 13 |
| | P-TNA248 | P-TNA249 | P-TNA250 | P-TNA251 | 74 |
| | P-TNA252 | P-TNA253 | P-TNA254 | P-TNA255 | 75 |

| | | | |
|---|---|---|---|
| | DISK NAME | | 76 |
| | DISK NAME | LINK INFORMATION | 77 |
| (01h) | DISC NAME / TRACK NAME | | 78 |
| | DISC NAME / TRACK NAME | LINK INFORMATION | 79 |
| (02h) | DISC NAME / TRACK NAME | | 80 |
| | DISC NAME / TRACK NAME | LINK INFORMATION | 81 |
| (03h) | DISC NAME / TRACK NAME | | 82 |
| CHARACTER TABLE SECTION | DISC NAME / TRACK NAME | LINK INFORMATION | 83 |
| (FEh) | DISC NAME / TRACK NAME | | 584 |
| | DISC NAME / TRACK NAME | LINK INFORMATION | 585 |
| (FFh) | DISC NAME / TRACK NAME | | 586 |
| | DISC NAME / TRACK NAME | LINK INFORMATION | 587 |

U-TOC SECTOR 1

ISRC MANAGEMENT TABLE

| No. 1 | ISRC | TIMER ID |
|---|---|---|
| No. 2 | ISRC | TIMER ID |
| ⋮ | ⋮ | ⋮ |
| No. n | | |

REPRODUCTION APPARATUS, RECORDING AND REPRODUCTION SYSTEM, REPRODUCTION METHOD, AND RECORDING AND REPRODUCTION METHOD

BACKGROUND OF THE INVENTION

This invention relates to a reproduction apparatus, a recording and reproduction system, a reproduction method, and a recording and reproduction method for dubbing recording wherein, for example, audio information reproduced from a recording medium is recorded onto another recording medium.

In recent years, disc media onto and from which audio data can be recorded and reproduced such as, for example, a mini disc (MD: trademark) and recording and reproduction apparatus ready for such disc media have spread popularly.

Also audio systems which employ, for example, a combination of an MD recorder/player which is a recording and reproduction apparatus ready for an MD and a CD player or the like have spread widely.

By the way, in such a system which includes an MD recorder/player and a CD player as described above, audio data are managed in a unit called "program". In the present specification, the term "program" is used to signify a group of data which is managed and recorded as a unit on a disc. For example, audio data for one tune (generally called "track") form one program. Therefore, in the following description, a program may be referred to also as a track.

Such an audio system as described above usually is capable of performing dubbing recording wherein audio data reproduced by a CD player is recorded onto an MD by means of an MD recorder/player.

Also a system is available which is designed so as to perform high speed dubbing in order to minimize the recording time.

In high speed dubbing, a disc rotational driving control system and a reproduction signal processing system of the CD player are controlled so that a CD is played back at a predetermined double (multiple) speed higher than a standard speed for normal reproduction. Also on the MD recorder/player side, a recording circuit system is controlled so as to operate at a double (multiple) speed corresponding to the reproduction speed of the CD and record the audio data reproduced by the CD player onto an MD.

For example, in an apparatus wherein a CD player serving as a reproduction apparatus and an MD recorder/player serving as a recording apparatus are incorporated integrally, it is easy to control the CD player and the MD recorder/player to simultaneously operate at a predetermined double (multiple) speed in order to perform such high speed dubbing as described above. Also in another system wherein a reproduction apparatus and a recording apparatus are formed as separate units, for example, if a cable for control data is used to connect the reproduction apparatus and the recording apparatus to each other so as to allow communication between them, then the operations of the reproduction apparatus and the recording apparatus can be controlled readily in synchronism with each other to realize high speed dubbing.

However, where such high speed dubbing as described above is considered from the point of view of protection of a work in the form of a tune or the like, it presents the following problems.

Basically, an action of dubbing is recognized as an action to be inhibited if possible because it is duplication of data of a work such as, for example, a tune and therefore is less profitable to the proprietor of the copyright.

Nevertheless, high speed dubbing is performed. This signifies that a greater number of tunes (tracks) can be dubbed per unit time when compared with normal dubbing at a standard speed.

Here it is assumed that, for example, a certain user tries to copy only the same tune (track) recorded on the same CD or a certain one CD onto such a large number of MDs as exceeds the range of personal use in common sense to produce a large number of duplicates and use the MDs on which the same contents are copied for a certain object.

If the user utilizes the high speed dubbing function in order to perform copying of the tune onto the MDs, then the MDs on which the tune (track) is copied can be produced efficiently in a shorter time than by normal dubbing at a standard speed. In short, the high speed dubbing has a phase that it promotes infringement upon the copyright.

Against the problem of the copyright described above, it is a common countermeasure to provide a digital audio apparatus such as, for example, an MD recorder/player not with a high speed dubbing function but only with a normal dubbing function at a standard speed.

It is to be noted, however, that mere inhibition of high speed dubbing is not preferable to a common user who performs dubbing, for example, within the range of personal use in common sense because the common user cannot enjoy the advantage that dubbing can be completed in a short time.

SUMMARY OF THE INVENTION

It is an object of the present invention to provide a reproduction apparatus, a recording and reproduction system, a reproduction method, and a recording and reproduction method by which use of a high speed dubbing function by a user exceeding a range of personal use can be suppressed to achieve protection of the copyright.

In order to attain the object described above, according to an aspect of the present invention, there is provided a reproduction apparatus for reproducing a program recorded on a recording medium, comprising reproduction means for reproducing a program recorded on the recording medium, time counting means for starting a time counting operation in response to an operation of the reproduction means, detection means for detecting identification information for identification of the recording medium or the program, storage means for storing the identification information detected by the detection means corresponding to the time counting means, comparison means for comparing the identification information stored in the storage means and the identification information detected by the detection means, and control means for inhibiting, when the comparison means discriminates that the identification information stored in the storage means and the identification information detected by the detection means coincide with each other, the reproduction by the reproduction means of the program corresponding to the identification information until the time counting of the time counting means corresponding to the identification information reaches a predetermined time.

According to another aspect of the present invention, there is provided a recording and reproduction system, comprising a reproduction apparatus for reproducing a program recorded on a first recording medium, and a recording apparatus for recording the reproduced program onto a second recording medium, the reproduction apparatus including reproduction means for reproducing a program recorded on the recording medium, time counting means for starting a time counting operation in response to an operation of the reproduction means, detection means for detecting identification information for identification of the recording medium or the program, storage means for storing the identification information detected by the detection means corresponding to the time counting means, comparison means for comparing the identification information stored in the storage means and the identification information detected by the detection means, and control means for inhibiting, when the comparison means discriminates that the identification information stored in the storage means and the identification information detected by the detection means coincide with each other, the reproduction by the reproduction means of the program corresponding to the identification information until the time counting of the time counting means corresponding to the identification information reaches a predetermined time, the recording apparatus including inputting means for receiving the program reproduced by the reproduction means, and recording means for recording the program received by the inputting means onto the second recording medium.

According to a further aspect of the present invention, there is provided a reproduction method for reproducing a program recorded on a recording medium, comprising a reproduction step of reproducing a program recorded on the recording medium, a time counting step of starting a time counting operation in response to the reproduction, a detection step of detecting identification information for identification of the recording medium or the program, a storage step of storing the identification information detected corresponding to the time counting, a comparison step of comparing the stored identification information and the detected identification information, and a control step of inhibiting, when it is discriminated in the comparison step that the stored identification information and the detected identification information coincide with each other, the reproduction of the program corresponding to the identification information until the time counting corresponding to the identification information reaches a predetermined time.

According to a still further aspect of the present invention, there is provided a recording and reproduction method for reproducing a program recorded on a first recording medium and recording the reproduced program onto a second recording medium, comprising a reproduction step of reproducing a program recorded on the first recording medium, a time counting step of starting a time counting operation in response to the reproduction, a detection step of detecting identification information for identification of the first recording medium or the program, a storage step of storing the identification information detected corresponding to the time counting, a comparison step of comparing the stored identification information and the detected identification information, a control step of inhibiting, when it is discriminated in the comparison step that the stored identification information and the detected identification information coincide with each other, the reproduction of the program corresponding to the identification information until the time counting corresponding to the identification information reaches a predetermined time, an inputting step of receiving the reproduced program, and a recording step of recording the received program onto the second recording medium.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 1 is a diagrammatic view showing a frame structure of a CD;

FIG. 2 is a diagrammatic view illustrating sub coding;

FIG. 4 is a diagrammatic view illustrating contents of definition of values placed in data in I1 to I5 of an ISRC;

FIG. 6 is a diagrammatic view illustrating U bit data of the digital audio interface;

FIG. 7 is a diagrammatic view illustrating C bit data of the digital audio interface;

FIG. 10 is a diagrammatic view illustrating the U-TOC sector 0 of the mini disc system;

FIG. 12 is a diagrammatic view illustrating the U-TOC sector 1 of the mini disc system;

DETAILED DESCRIPTION OF THE PREFERRED EMBODIMENT

Figure 3:
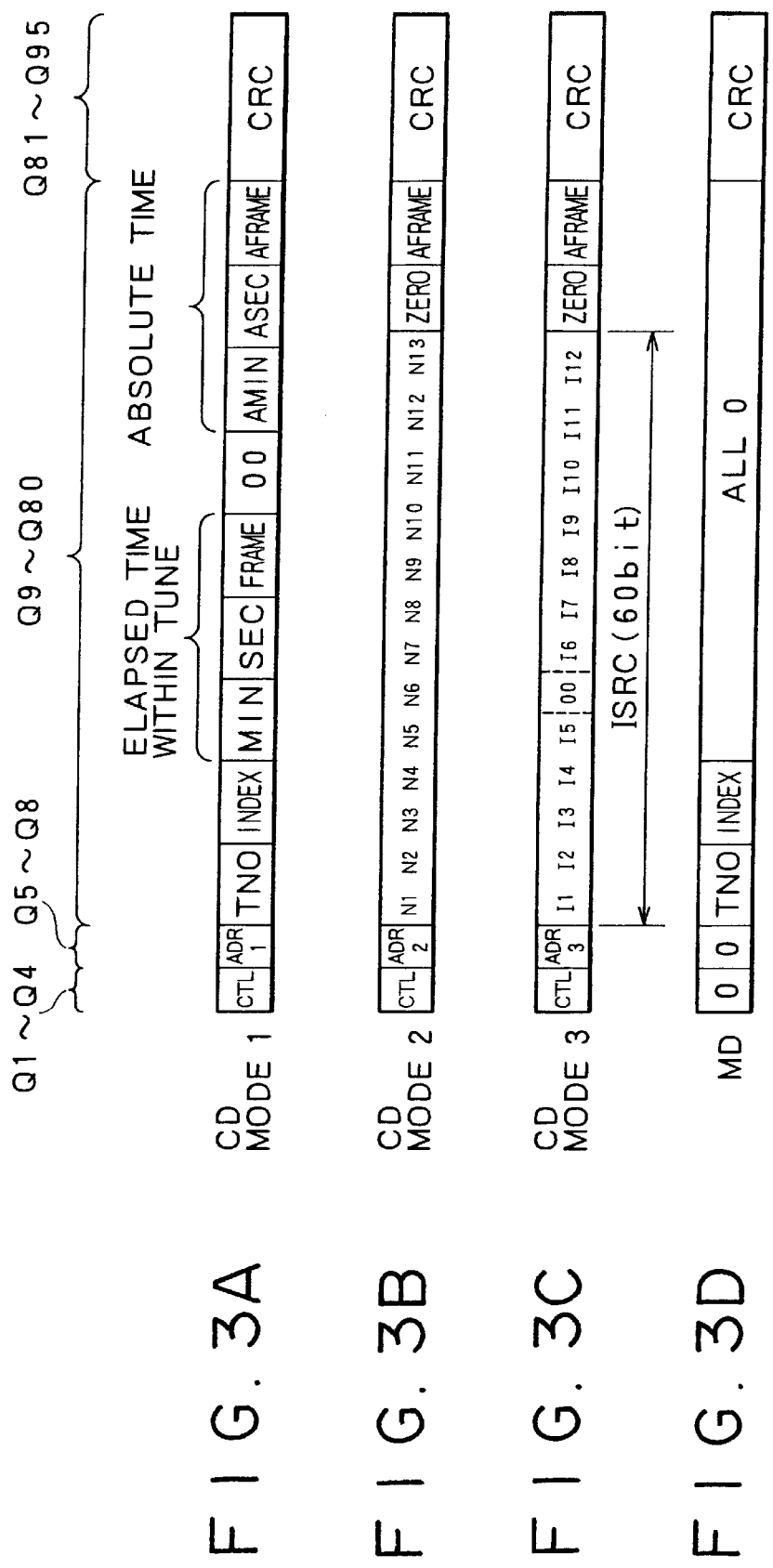
FIG. 3A is a diagrammatic view showing a sub format of a Q channel of a CD in a mode 1.
FIG. 3B is a similar view but showing a sub format of the Q channel of the CD in a mode 2.
FIG. 3C is a similar view but showing a sub format of the Q channel of the CD in a mode 3.
FIG. 3D is a diagrammatic view showing a sub format of a Q channel of an MD.

A preferred embodiment of the present invention is described below with reference to the drawings. In the present embodiment, an MD (mini disc) recorder/player is used as a recording apparatus, and a CD (compact disc)

player is used as a reproduction apparatus which supplies program data when dubbing is to be performed by the MD recorder/player. The MD recorder/player and the CD player described below may be formed as separate units from each other and connected to each other upon dubbing or may alternatively be formed as a single unitary apparatus.

The description proceeds in the following order.
1. Sub Code
2. Digital Audio Interface
3. CD-MD Dubbing System
    3-1. Construction of the MD Recorder/Player
    3-2. MD Track Format
    3-3. U-TOC
    3-4. Construction of the CD Player
4. Limitation Operation upon High Speed Dubbing
    4-1. First Example
    4-2. Second Example
    4-3. Third Example 1. Sub Code First, sub codes recorded on a CD (compact disc) and an MD (mini disc) are described with reference to FIGS. 1 to 4.

In a CD system, the minimum unit of data to be recorded is one frame and one block is composed of 98 frames as well known in the conventional art.

One frame has such a structure as shown in FIG. 1. In particular, referring particularly to FIG. 1, one frame is composed of 588 bits. The top 24 bits represent synchronization data, and the following 14 bits are used as a sub code data area. The sub code data area is followed by data and parities.

One block is composed of 98 frames which have such a structure as described above, and sub code data extracted from such 98 frames are collected to form such sub code data of one block as shown in FIG. 2.

The sub code data from the first and second ones (frame 98n+1, frame 98n+2) of the 98 frames represent synchronization patterns (S0, S1). The third to 98th frames (frame 98n+3 to frame 98n+98) form channel data of 98 bits, that is, sub code data of P, Q, R, S, T, U, V and W channels.

Among the channels of the sub code data, the P channel and the Q channel are used for management of accessing and so forth. However, the P channel merely indicates a pause portion between tracks, and the Q channel (Q1 to Q96) is used for finer control. For a CD, the Q channel data of 98 bits is constructed in such a manner as illustrated in FIGS. 3A, 3B and 3C.

As well known, the Q channel data for a CD is different in contents among different modes, that is, mode 1, mode 2 and mode 3.

First, the Q channel data for a CD in the mode 1 illustrated in FIG. 3A is described.

As seen from FIG. 3A, the top four bits Q1 to Q4 represent control data CTL and are used for an audio channel number, emphasis, identification of a CD-ROM and so forth.

In particular, the control data of 4 bits are defined in the following manner.

"0***"... 2-channel audio
"1***"... 4-channel audio
"*0**"... CD-DA (CD digital audio)
"*1**"... CD-ROM
"**0*"... digital copy inhibited
"**1*"... digital copy permitted
"***0"... without pre-emphasis
"***1"... with pre-emphasis For the control data CTL, a required value is placed in accordance with contents set actually to the CD. This similarly applies to control data CTL (Q1 to Q4) of Q channel data in the mode 2 and the mode 3 which are hereinafter described.

The following 4 bits Q5 to Q8 represent an address ADR and are control bits for data of the bits Q9 to Q80.

Where the 4-bit address is "0001"("1" in decimal notation), this indicates that the sub Q data of Q9 to Q80 are Q data of an audio CD of the mode 1.

The 72 bits of Q9 to Q80 represent sub Q data, and the remaining bits Q81 to Q96 represent a CRC.

The 72 bits of Q9 to Q80 as contents of the sub code represent information illustrated in FIG. 3A for individual 8 bits. First, a track number (TNO) is recorded. In particular, each of tracks #1 to #n has one of values "01" to "99". In a lead-out area, the track number is "AA".

The track number (TNO) is followed by an index (INDEX) in which information with which each track can be further divided finely is recorded.

As elapsed times in the track, MIN (minute), SEC (second) and FRAME (frame number) are indicated.

Further, in AMIN, ASEC and AFRAME, an absolute time address is recorded as a minute (AMIN), a second (ASEC) and a frame number (AFRAME). The absolute time address is time information consecutively applied up to the lead-out beginning with 0 minute, 0 second, 0 frame at the start point of the first track. In short, the absolute time address is absolute address information to be for management of all tracks on the disc.

FIG. 3B shows a structure of the Q channel data in the mode 2.

The address ADR (Q5 to Q8) of the channel data in the mode 2 in this instance is "0010"("2" in decimal notation), which indicates that the following sub Q data of Q9 to Q80 are contents of Q data of the audio CD in the mode 2.

In the sub Q data of Q9 to Q80 in the mode 2, data of N1 to N13 of 13 digits (4×13=52 bits) are placed. Further, a bit section of '0' is disposed following the data N1 to N13 and is followed by a frame number (AFRAME) of an absolute time and a CRC.

The data N1 to N13 is identification information indicating a product number of the CD and is used for bar coding.

FIG. 3C shows a structure of the Q channel data in the mode 3. The Q channel data of the mode 3 is permitted to be inserted, as a specification of a CD, in accordance with a condition that it is inserted once or less into successive 100 sub coding blocks.

The address ADR (Q5 to Q8) of the Q channel data in the mode 3 is "00011"("3" in decimal notation), which indicates that the following sub Q data of Q9 to Q80 is contents of Q data of an audio CD in the mode 3.

In the area of the sub Q data of Q9 to Q80 in the mode 3, an ISRC (International Standard Recording Code) composed of 60 bits of I1 to I12 are placed.

The ISRC is information for providing a unique number (identifier) to a track as a tune and is an international standard code which is used to specify a tune (track) recorded on a CD, for example, for management of the copyright.

The ISRC is followed by a bit section of '0', which in turn is followed by a frame number (AFRAME) of an absolute time and a CRC.

Of the data I1 to I12 which compose the ISRC, the data I1 to I5 are each formed from 6 bits, and corresponding characters to the values are prescribed in a format as illustrated in FIG. 4. The data I6 to I12 are each formed from 4 bits and represented by BCD representations. Further, a section of '0' of 2 bits is interposed between the data I1 to I5 and the data I6 to I12.

The 12 bits of the data I1 to I2 form a Country-code, and a name of a country can be specified with 2 characters represented in accordance with the contents of definition illustrated in FIG. 4.

The 18 bits of the data I3 to I5 form an Owner-code, and 24,480 different owners can be specified with 2 alphabets and 2 alphanumeric characters represented in accordance with the definition illustrated in FIG. 4.

The 8 bits of the data I6 to I7 represent a year of record by representing a numeral with the data I6 and I7 of 4 bits in accordance with the BCD.

The 20 bits of the data I8 to I12 represent a serial number of the track (a serial number of the recording) by representing a numeral with the data I8 to I12 of 4 bits in accordance with the BCD.

An ISRC including such information as described above is inserted as a sub code having a unique value to each track so that it can specify the track (tune).

Meanwhile, the structure of the Q channel data of a mini disc is such as illustrated in FIG. 3D.

In a mini disc, a track number (TNO), index information (INDEX) and a CRC code are provided, but no time information is added.

Further, those areas of the mini disc which correspond to the control data CTL (Q1 to Q4) and the address ADR (Q5 to Q8) have "0000" placed therein.

2. Digital Audio Interface

Subsequently, a format used for data transmission by a digital audio interface between a plurality of digital audio apparatus is described.

Figures 5A, 5B:
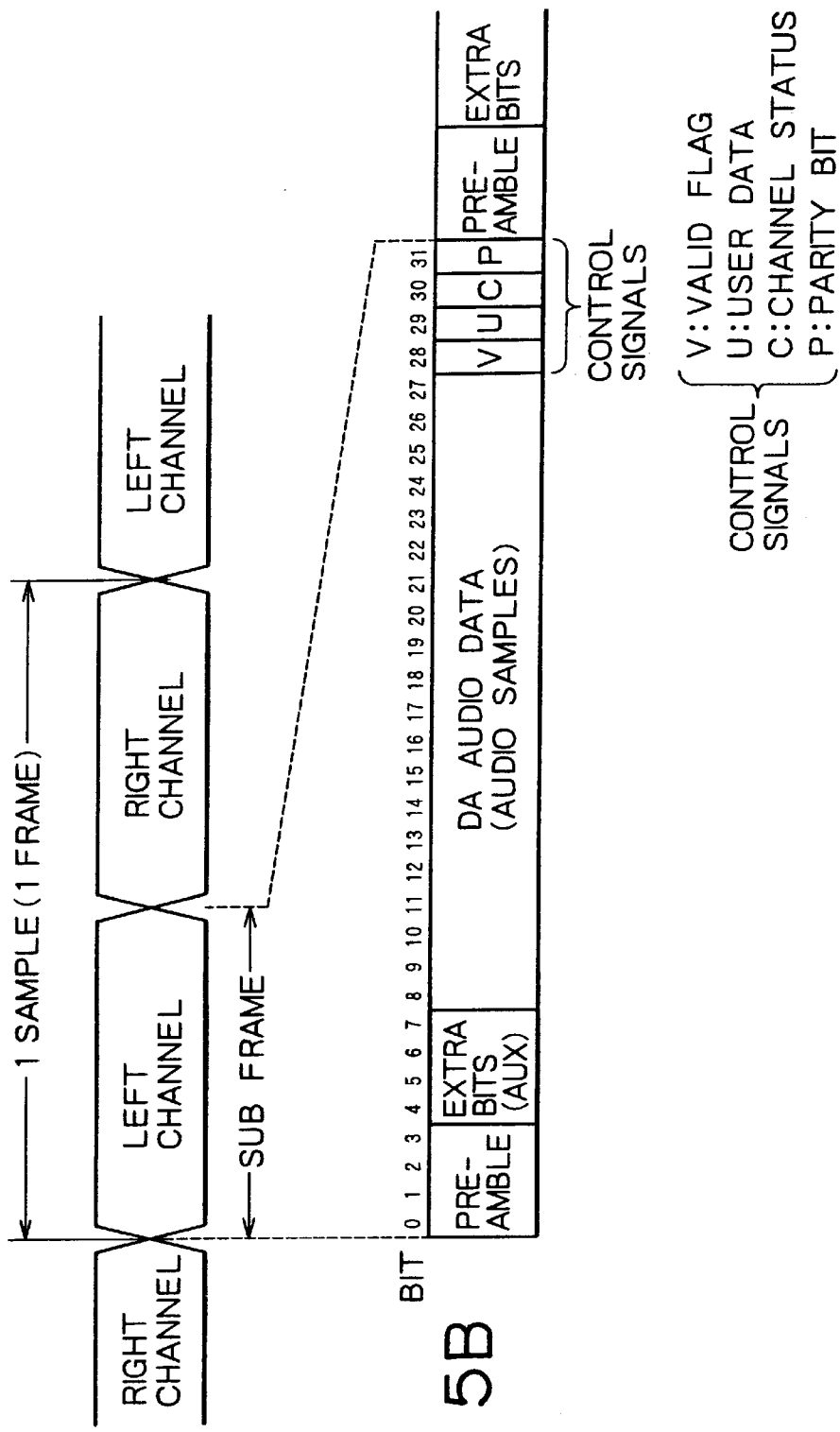
FIG. 5A is a diagrammatic view showing an I/O format of a digital audio interface.
FIG. 5B is a diagrammatic view showing a sub frame of the digital audio interface.

FIGS. 5A and 5B show a digital audio interface format (hereinafter referred to as I/O format).

In the I/O format, one frame is defined by a sampling period (1/FS) and used as a basic unit as seen in FIG. 5A. Digital output signals of the left (L) channel and the right (R) channel in one frame are outputted in the order of the left channel to right channel each beginning with the LSB (least significant bit) and ending with the MSB (most significant bit).

Data corresponding to each of the channels are called sub frame, and a construction of a sub frame is shown in FIG. 5B.

A sub frame is composed of 32 bits, and one frame is composed of two sub frames for the left and right channels.

The top 4 bits of a sub frame represent a preamble and are used for synchronization and identification of the sub frame.

The following 4 bits are extra bits (AUX) and are followed by audio data DA of 20 bits as main data.

The audio data DA is followed by control data represented by V, U, C and P of 1 bit.

The V bit is a validity flag which indicates, when it is "0", that the sub frame data is valid (reliable), but when it is "1", that the sub frame data is invalid (not reliable). An apparatus on the reception side can determine a data processing operation to be performed based on the validity flag.

The U bit represents user data. As data of 1,176 bits in average collected from sub frames by which the U bit is transmitted, for example, such control data as illustrated in FIG. 6, that is, a sub code, is represented.

First, as data which correspond to the 0th and first frames, the sub code synchronization pattern shown in FIG. 2 is placed. It is to be noted that, while one frame of the U bit is formed from 12 bits as seen in FIG. 6, in the present example, the last 4 bits in each frame are dummy bits.

In each of the following second to 97th frames, the start bit "1" is placed at the top and followed by data of sub codes Q to W illustrated in FIG. 2 and dummy data of 4 bits.

In short, data of the sub codes Q to W of a CD, a mini disc or the like on the reproduction side are placed as they are in the U bits. It is to be noted that, while the distance between two successive start bits in FIG. 6 is 12 bits, the distance between start bits can be varied within 8 to 16 bits by varying the number of dummy bits.

The C bit shown in FIGS. 5A and 5B represents channel status data.

For the channel status, a data format including 192 C bits (one word) included in and collected from sub frames is prescribed. The format of the channel status is illustrated in FIG. 7.

It is discriminated based on the first bit (bit 0) of one word whether or not the transmission side apparatus is for home use. The following 5 bits from bit 1 to bit 5 represent control information. For example, the bit 2 is an identification bit for protection of the copyright, and the bit 3 is an identification bit of whether or not emphasis is involved.

The following bits from bit 8 to bit 15 represent a category code CC. The bit 15 is called L bit and indicates a generation of the digital audio data. Generally, the bit 15 is "1" for recorded software issued commercially. The bits from bit 8 to bit 14 represent a specific code applied in accordance with the transmission side apparatus.

It is prescribed that, for example, if the transmission side apparatus is a mini disc system, then the category code CC is "1001001L", but if the transmission side apparatus is a compact disc system, then the category code CC is "1000000L".

The following bits from bit 16 to bit 19 represent the number of a source and is used for identification of each apparatus where a plurality of apparatus of the same category are connected.

The bits from bit 20 to bit 23 represent a channel number and hence a channel type of the digital audio interface.

The bits from bit 24 to bit 27 represent an identification code of a sampling frequency, and the bit 28 and the bit 29 represent the accuracy of the sampling frequency.

The bit 32 and the following bits are unused.

The P bit illustrated in FIG. 5B is a parity bit. For the parity bit, for example, the even parity is used. The parity bit is used for error detection of the extra bit, the audio data DA and the bits V, U and C.

3. CD-MD Dubbing System

3-1. Construction of the MD Recorder/Player

Subsequently, a CD-MD dubbing system of a preferred embodiment of the present invention is described. First, a construction of an MD recorder/player which functions as a recording apparatus in the dubbing system is described.

Figure 8:
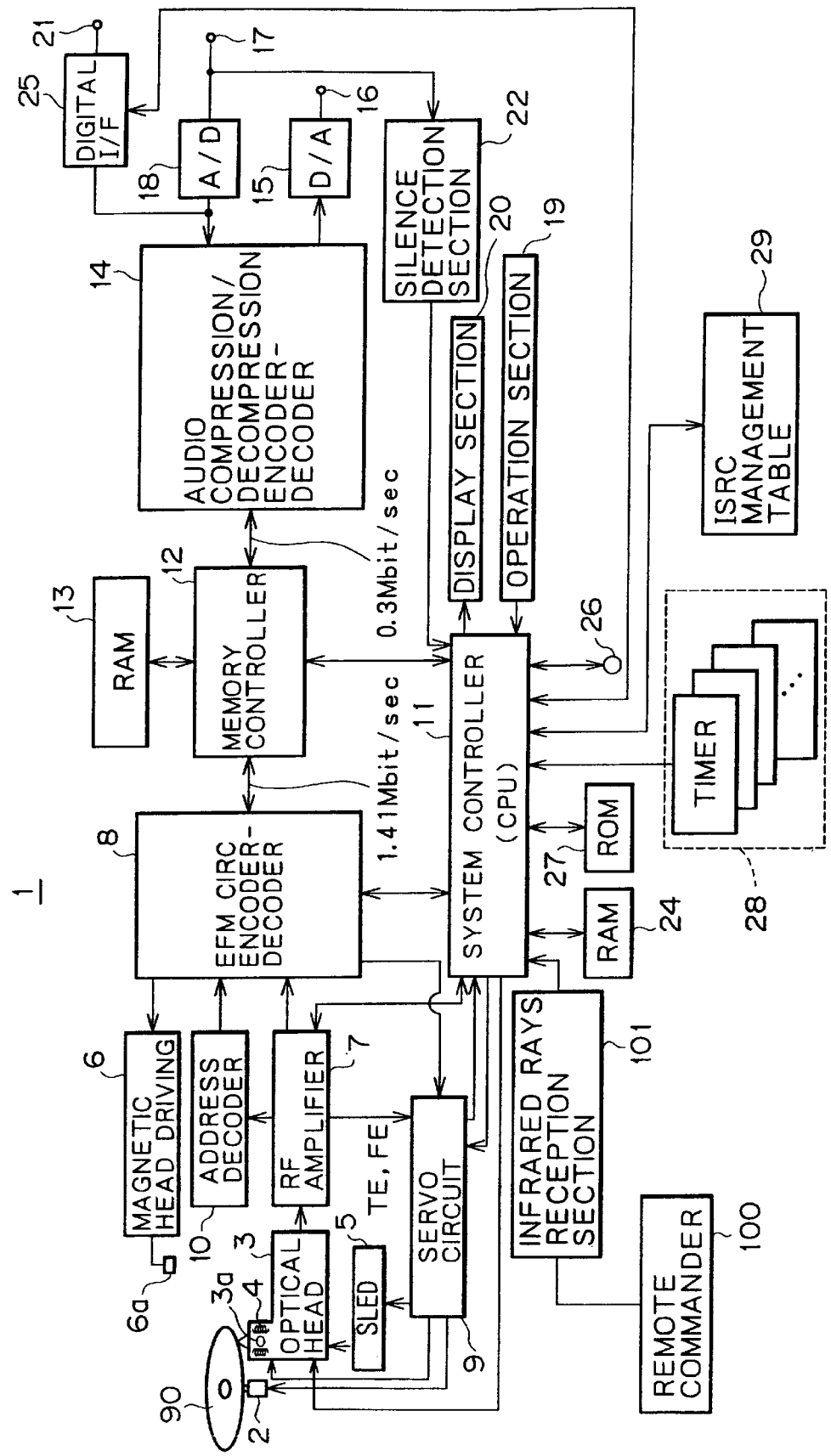
FIG. 8 is a block diagram showing an example of an internal construction of a recording apparatus in the form of an MD recorder/player which composes a dubbing system to which the present invention is applied.

FIG. 8 is a block diagram of the MD recorder/player in the present embodiment.

Referring to FIG. 8, the MD recorder/player is generally denoted at 1 and can perform recording and reproduction of audio data onto and from a magneto-optical disk (MD) 90.

The magneto-optical disk 90 is accommodated in a cartridge on which a shutter mechanism is provided. Upon recording or reproduction, the shutter mechanism is opened or closed, and when the shutter mechanism is open, light from an optical pickup or optical head 3 can be irradiated upon the magneto-optical disk 90 and also a magnetic field from a magnetic head 6a can be applied to the magneto-optical disk 90.

The magneto-optical disk 90 is controlled to be rotated in a CLV (contact linear velocity) by a spindle motor 2.

The optical head 3 is located in an opposing relationship to the magnetic head 6a while the magneto-optical disk 90 loaded in the MD recorder/player 1 is interposed between the optical head 3 and the magnetic head 6a. The optical head 3 includes an object lens 3a, a two-axis mechanism 4, a semiconductor laser not shown, and a light reception section not shown for receiving light emitted from the semiconductor laser and reflected from a surface of the magneto-optical disk 90.

The two-axis mechanism 4 includes a focusing coil for feeding the object lens 3a in a direction toward and away from the magneto-optical disk 90, and a tracking coil for feeding the object lens 3a in a radial direction of the magneto-optical disk 90.

The MD recorder/player 1 further includes a sled mechanism 5 for moving the entire optical head 3 over a great distance in a radial direction of the magneto-optical disk 90.

Reflected light information detected by the light reception section in the optical head 3 is supplied to a RF amplifier 7, by which it is subject to voltage conversion and matrix arithmetic processing so that a focusing error signal FE and a tracking error signal TE as well as a RF signal are produced.

The RF signal which is a reproduction signal is produced based on a magnetic vector detected making use of a magnetic Kerr effect of reflected light by irradiating light upon the magneto-optical disk 90 with a laser power lower than that upon recording.

The focusing error signal FE and the tracking error signal TE produced by the RF amplifier 7 are subject to phase compensation and gain adjustment by a servo circuit 9 and are then applied to the focusing coil and the tracking coil, respectively, of the two-axis mechanism 4 through drive amplifiers (not shown).

Further, from the tracking error signal TE, a sled error signal is produced by a LPF (low pass filter) in the servo circuit 9 and supplied to the sled mechanism 5 through a sled drive amplifier (not shown).

The RF signal produced by the RF amplifier 7 is binary digitized and EFM demodulated (eight to fourteen demodulation) by an EFM/CIRC encoder-decoder 8, and is then subject to CIRC (cross interleave Reed Solomon coding) error correction processing, whereafter it is supplied to a memory controller 12.

The magneto-optical disk 90 has a groove formed thereon in advance in a meandering relationship with a predetermined frequency (in the present embodiment, 22.05 KHz) and has address data recorded thereon by FM modulation.

The address data is extracted by FM demodulation of the same through a BPF (band pass filter), which passes only a predetermined frequency, by an address decoder 10.

The EFM/CIRC encoder-decoder 8 produces a spindle error signal for controlling rotation of a disc based on the binary digitized EFM signal or the address data extracted by the address decoder 10 and applies the spindle error signal to the spindle motor 2 through the servo circuit 9.

Further, the EFM/CIRC encoder-decoder 8 controls a pull-in operation of a PLL (phase locked loop) based on the binary digitized EFM signal to produce a reproduction clock signal for decoding processing.

Binary digitized data after error correction is written into a buffer memory 13 at a transfer rate of 1.4 Mbit/sec by the memory controller 12.

If data of an amount greater than a predetermined amount is stored in the buffer memory 13, then the memory controller 12 reads out the stored data from the buffer memory 13 at a transfer rate of 0.3 Mbit/sec which is sufficiently lower than the transfer rate for writing and outputs the read out data as audio data.

Since data are outputted as audio data after they are stored once into the buffer memory 13 in this manner, even if inadvertent track jumping or the like is caused by a disturbance such as, for example, vibrations and continuous reading out of data from the optical head 3 is interrupted, continuous (free from sound interruption) output of sound of an audio output of the MD recorder/player 1 can be realized because data corresponding to a time required for re-positioning of the optical head 3 to an address from which the track jumping has occurred are stored in the buffer memory 13 in advance.

In the present embodiment, where a RAM of 4 Mbytes is used for the buffer memory 13, audio data for approximately 10 seconds can be fully stored in the buffer memory 13.

It is to be noted that the memory controller 12 is controlled by a system controller 11.

Data read out from the magneto-optical disk 90 was compressed by a predetermined compression method (in the present embodiment, for example, the ATRAC (acoustic transferred adapted coding) method) upon recording of the same. Meanwhile, data read out from the buffer memory 13 by the memory controller 12 is digital data which has been decompressed by a audio compression encoder-decompression decoder 14, and is applied to a D/A converter 15.

The D/A converter 15 converts the digital data, which has been decompressed by the audio compression encoder-decompression decoder 14, into an analog audio signal. The analog audio signal is supplied from an output terminal 16 to a reproduction output system not shown such as an amplifier and a speaker or a headphone, by which it is outputted as reproduction sound.

In such a reproduction operation as described above, the system controller 11 operates in response to an operation of an operation section 19 to transfer various servoing commands to the servo circuit 9 or provide a control instruction for the buffer memory 13 to the memory controller 12. Further, the system controller 11 controls a display section 20 to display character information of an elapsed time for playing, a title of a program being reproduced and so forth or performs spindle servoing control or decoding processing control by the EFM/CIRC encoder-decoder 8.

Further, a remote commander 100 is provided together with the operation section 19 so that the user may perform various operations. The remote commander 100 outputs a command corresponding to an operation of a user, for example, as an infrared modulation signal. The command, that is, operation information, is converted into an electric signal by an infrared rays reception section 101, and the electric signal is supplied to the system controller 11. The system controller 11 performs necessary control processing in response to the operation information from the infrared rays reception section 101.

In order for the MD recorder/player 1 to record sound of a tune or the like onto the disk 90, the sound signal is supplied to an input terminal 17 or another input terminal 21.

An analog audio signal outputted from an analog output terminal of a reproduction apparatus such as, for example, a CD player is applied to the input terminal 17 and converted into a digital signal by an A/D converter 18, and the digital signal is supplied to the audio compression encoder-decompression decoder 14.

On the other hand, a digital audio signal transmitted in the form of digital data from a digital output terminal of a reproduction apparatus such as a CD player is inputted to the input terminal 21. In this instance, decoding regarding a digital communication format, control data extraction and so forth are performed by a digital interface section 25, and a digital audio signal extracted by the decoding processing by the digital interface section 25 is supplied to the audio compression encoder-decompression decoder 14.

It is to be noted that, in the present embodiment, the digital interface section 25 has a construction compliant with the IEEE (The Institute of Electrical and Electronics Engineers) 1394 interface.

The IEEE 1394 interface has, as well known, the form of a serial data interface which allows mutual transmission of data between different apparatus and transmission/reception of commands/responses for remote control and so forth.

In the present embodiment, the MD recorder/player 1 and a CD player which is a reproduction apparatus hereinafter described are connected to each other for mutual communication by the IEEE 1394 interface so that digital dubbing operation wherein digital audio data reproduced by the CD player can be inputted to and recorded by the MD recorder/player 1 while it remains in the form of a digital signal is allowed. Further, also it is possible to establish synchronization of reproduction or recording starting timings, for example, upon dubbing recording or the like or synchronization of high speed dubbing between the MD recorder/player 1 and the CD player.

A digital audio signal inputted to the audio compression encoder-decompression decoder 14 is subject to compression coding by the ATRAC (acoustic transferred adapted coding) method, and the compressed digital audio signal is stored once into the buffer memory 13 at a transfer rate of 0.3 Mbit/sec by the memory controller 12.

The memory controller 12 detects that a predetermined amount of compressed data is stored in the buffer memory 13, and permits reading out from the buffer memory 13.

The compressed data read out from the buffer memory 13 is subject to processing such as addition of error correction codes of the CIRC system, EFM modulation and so forth by the EFM/CIRC encoder-decoder 8 and is then applied to a magnetic head driving circuit 6.

The magnetic head driving circuit 6 performs application driving of the magnetic head 6a with a magnetic field of the N pole or the S pole in response to the data supplied thereto.

Upon recording which involves such application of a magnetic field, the system controller 11 controls the emission power of the semiconductor laser not shown of the optical head 3 to a predetermined level higher than that upon reproduction to raise the temperature of the surface of the magneto-optical disk 90 to its Curie temperature. Consequently, the magnetic field information applied from the magnetic head 6a is fixed to the recording surface of the magneto-optical disk 90. In short, the data is recorded as the magnetic field information.

Also upon recording, the system controller 11 transfers various servoing commands to the servo circuit 9 or supplies a control instruction for the buffer memory 13 to the memory controller 12. Further, the system controller 11 controls the display section 20 so that it may display a recording elapsed time, a track number of a program being recorded and so forth, or performs spindle servoing control, encoding processing control and so forth by the EFM/CIRC encoder-decoder 8.

Further, in processing regarding a digital input, the system controller 11 fetches extracted control data from the digital interface section 25.

In processing regarding an analog signal input, the analog audio signal from the input terminal 17 is supplied also to a silence detection section 22, by which a silence situation of the input audio signal between a time between tunes or the like is supervised. Such supervision information is supplied to the system controller 11.

A RAM 24 is a memory for temporarily storing various kinds of information required for the system controller 11 to execute required processing.

A ROM 27 is formed from, for example, a non-volatile memory. Contents of data stored in the ROM 27 can be rewritten under the control of the system controller 11, but can be retained even if the power supply is stopped. In the ROM 27, a program and various data necessary for the system controller 11 to implement various processes to be executed are stored.

Further, in the present embodiment, in order to implement a dubbing limitation operation upon dubbing recording which is hereinafter described, a timer section 28 and an ISRC management table 29 are provided. Also a construction of the timer section 28 and the ISRC management table 29 is hereinafter described together with description of a dubbing limitation operation. It is to be noted that, for the timer section 28 and the ISRC management table 29, for example, a partial area of the ROM 27 described above may be used.

The operation section 19 is provided to allow a user to perform various operations for instructing the MD recorder/player 1 to perform a required operation. For example, the operation section 19 includes operation elements for inputting instructions for reproduction, pause, fast feeding, rewinding, recording and stopping, instructions for editing operations for deletion of a track, connection of tracks and division of a track and character information such as a track name or a disc name. A command signal corresponding to an operation performed for the operation section 19 is transmitted to the system controller 11, and the system controller 11 executes required control processing in response to the command signal.

It is to be noted that, in the present embodiment, the MD recorder/player 1 may be constructed such that an operation for performing dubbing recording, for example, from a CD player which is hereinafter described to the MD recorder/player 1 can be performed using the operation section 19 of the MD recorder/player 1 side.

Further, actually a remote commander having operation functions similar to those of the operation section 19 may be prepared so that the MD recorder/player 1 may receive a command signal outputted in response to an operation performed for the remote commander.

A terminal 26 is used to perform communication of control signals between, for example, a CD player and the MD recorder/player 1 in such a case that a reproduction audio signal in the form of an analog signal is outputted and dubbing recording is performed by the MD recorder/player 1, for example, without using the IEEE 1394 digital interface. By the communication through the terminal 26, it is possible to establish, between the MD recorder/player 1 and a CD player which is hereinafter described, synchronization between reproduction starting/ending timings of the CD player side and a recording starting timing of the MD recorder/player 1 side, for example, upon analog dubbing recording, synchronization for high speed dubbing and so forth.

3-2. MD Track Format

Here, a cluster format of a recording data track of the magneto-optical disk (MD) 90 is described.

A recording operation in a mini disc system is performed in a unit called cluster. A format of the cluster is shown in FIG. 9.

Figure 9:
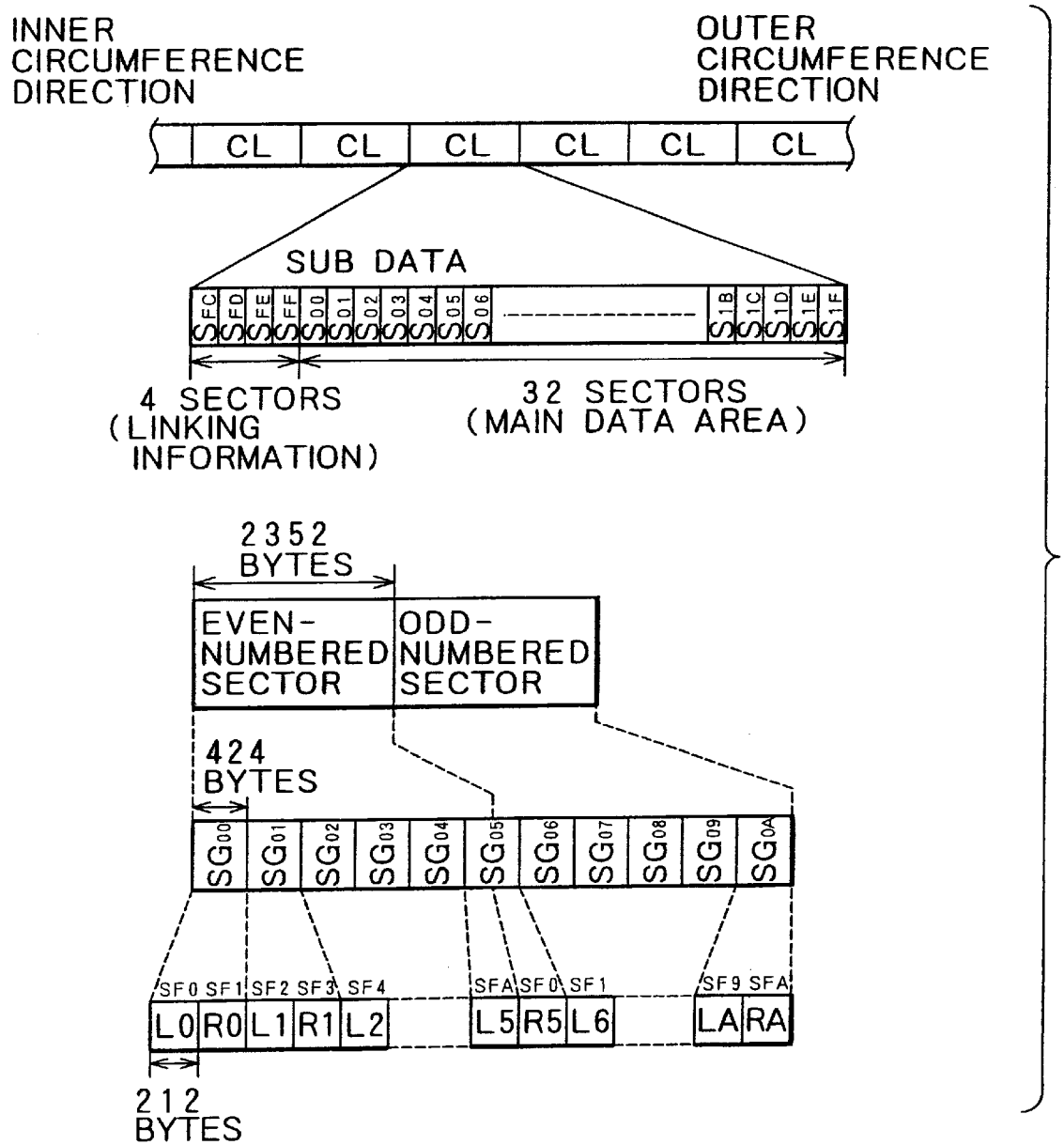
FIG. 9 is a diagrammatic view illustrating a cluster format of a mini disc system.

In a recording track in the mini disc system, clusters CL are formed successively as seen in FIG. 9, and one cluster makes a minimum unit upon recording. One cluster corresponds to 2 to 3 circumferential tracks.

Referring to FIG. 9, one cluster CL includes a sub data region of four sectors SFC to SFF and a main data region of 32 sectors S00 to S1F. The main data are, for an audio signal, audio data compressed by the ATRAC processing described hereinabove.

One sector is a unit of data including 2,352 bytes.

The sub data region of four sectors is used for sub data or as a linking area, and TOC data, audio data and so forth are recorded into the main data region of 32 sectors. Since the interleave length of the CIRC is longer than one sector length (13.3 msec) adopted by a CD or the like when error correction processing is performed, the sectors of the linking area are provided waste sectors for avoiding the contradiction and are basically provided as a reserved region. However, the sectors may otherwise be used for some processing or for recording of some control data.

It is to be noted that an address is recorded for each one sector.

One sector is further divided into units called sound groups. More particularly, two sectors are divided into 11 sound groups.

More specifically, as seen from FIG. 9, two successive sectors including an even-numbered sector such as the sector S00 and an odd-numbered sector such as the sector S01 include sound groups SG00 to SG0A. One sound group is formed from 424 bytes and includes an amount of sound data corresponding to the time of 11.61 msec.

Data are recorded separately for the L channel and the R channel in one sound group SG. For example, the sound group SG00 includes L channel data L0 and R channel data R0, and the sound group SG01 includes L channel data L1 and R channel data R1.

It is to be noted that 212 bytes which make a data region for the L channel or the R channel is called sound frame.

3-3. U-TOC

While such a cluster format as shown in FIG. 9 is formed over the entire area of the magneto-optical disk (MD) 90, the area of the magneto-optical disk 90 is divided in a radial direction and the innermost circumference side area is used as a management area while a program area is formed next to the management area.

It is to be noted that a reproduction only area in which reproduction only data are recorded as phase pits is provided on the innermost circumference of the magneto-optical disk 90, and a magneto-optical area which can be magneto-optically recorded and reproduced is formed next to the reproduction only area. The management area includes the reproduction only area and the innermost circumference portion of the magneto-optical area.

The management area of the magneto-optical area is followed by a program area, in which audio data are recorded on sectors of the main data area of FIG. 9.

Meanwhile, as the management area, a P-TOC (premastered TOC) to be used for area management and so forth of the entire disc is provided in the reproduction only area. In the management area following the P-TOC, catalog information (U-TOC: user table of contents) to be used for management of programs (tunes and so forth) recorded in the program area is recorded.

In order to perform a recording/reproduction operation for the magneto-optical disk 90, it is necessary to read out management information recorded on the magneto-optical disk 90, that is, the P-TOC and the U-TOC. The system controller 11 discriminates an address of an area of the magneto-optical disk 90 to be recorded or an address of an area of the magneto-optical disk 90 to be reproduced. The management information is stored into the buffer memory 13. Consequently, the buffer memory 13 is divided into a buffer area for recording data/reproduction data and another area for storing management information.

The system controller 11 controls, when the magneto-optical disk 90 is loaded into the MD recorder/player 1, so that a reproduction operation of the innermost circumference side of the magneto-optical disk 90 on which management information is recorded is performed to read out the management information and the management information is stored into the buffer memory 13 so that the management information may thereafter be referred to upon a recording/reproduction operation for the MD recorder/player 1.

While the U-TOC is re-written in response to recording or erasure of data or an editing operation such as inputting of character information, the system controller 11 performs updating processing for the U-TOC information stored in the buffer memory 13 each time a recording/erasure/editing operation is performed, and re-writes the U-TOC area of the magneto-optical disk 90 at a predetermined timing in response to the updating operation.

Here, U-TOC sectors as management information to be used for management of recording and reproduction operations of tracks (tunes) and so forth on the disc 90 are described.

FIG. 10 illustrates the format of the U-TOC sector 0.

It is to be noted that, as the U-TOC sectors, the sectors from the sector 0 up to the sector 31 can be provided. In particular, the sectors (S00 to S1F) of one cluster in the management area can be used. The sector 1 and the sector 4 can be used as an area in which character information is to be recorded and the sector 2 is used as an area into which recording dates/times are to be recorded.

The U-TOC sector 0 is a data area in which management information principally regarding tunes recorded by a user and free areas into which tunes can be recorded newly is recorded. In particular, a start point (start address) and an end point (end address) of each of programs recorded in the program area and copy protect information, emphasis information and so forth as characters (track modes) of the programs are managed in the sector 0.

For example, if a user intends to record a certain tune onto the disc 90, then the system controller 11 searches out a free area on the disc 90 from the U-TOC sector 0 and records audio data into the free area. On the other hand, upon reproduction, an area in which a tune to be reproduced is recorded is discriminated from the U-TOC sector 0, and the area is accessed to perform a reproduction operation.

As seen in FIG. 10, in the U-TOC sector 0, a header part in which a synchronization pattern of 12 bytes is formed is recorded first, and following the header part, data of 3 bytes ("Cluster H", "Cluster L" and "SECTOR") as an address of the sector, a maker code ("maker code") and a model code ("model coded") representing a manufacture of the disk, the first program number ("First TNO"), the last program number ("Last TNO"), a sector use situation ("used sectors") and a disk serial number ("disc serial No"), a disk ID and so forth are recorded.

Further, a correspondence table indication data section is recorded which is composed of a pointer P-DFA (pointer for defective area) indicating the top position of a slot in which position information of a defect which has appeared on the disc is stored, a pointer P-EMPTY (pointer for empty slot) indicating a situation of use of slots, a pointer P-FRA (pointer for free area) indicating the top position of a slot for managing recordable areas, pointers P-TNO1, P-TNO2, ..., P-TNO255 individually indicating the top positions of slots corresponding to individual program numbers.

A management table section in which 255 slots of 8 bytes are provided is provided following the correspondence table indication data section. In each slot, a start address, an end address, a track mode and link information are managed.

In the magneto-optical disk 90 in the present embodiment, data need not necessarily be recorded continuously on the recording medium, and a sequential data string may be recorded discretely (in a plurality of parts) on the recording medium (it is to be noted that a part signifies a portion in which continuous data in time are recorded in physically continuous clusters).

In a reproduction apparatus (the MD recorder/player 1 of FIG. 8) adapted for the magneto-optical disk 90, data are stored once into the buffer memory 13 and the write rate and the readout rate for the buffer memory 13 are made different from each other as described above. Therefore, in the MD recorder/player 1, data recorded discretely on the magneto-optical disk 90 are successively accessed by the optical head 3 and the thus accessed data are stored into the buffer memory 13, and consequently, the data can be reproduced as a sequential data string from the buffer memory 13.

In other words, since, in the MD recorder/player 1, the write rate into the buffer memory 13 upon reproduction is higher than the readout rate from the buffer memory 13, continuous sound reproduction is not interrupted.

Further, even if a program shorter than another program recorded already is overwritten on the program recorded already, the MD recorder/player 1 can use the recording capacity of the disk efficiently by designating the remaining portion of the recorded program, which is not overwritten, as a recordable area (an area managed beginning with the pointer P-FRA) without erasing the same.

Figure 11:
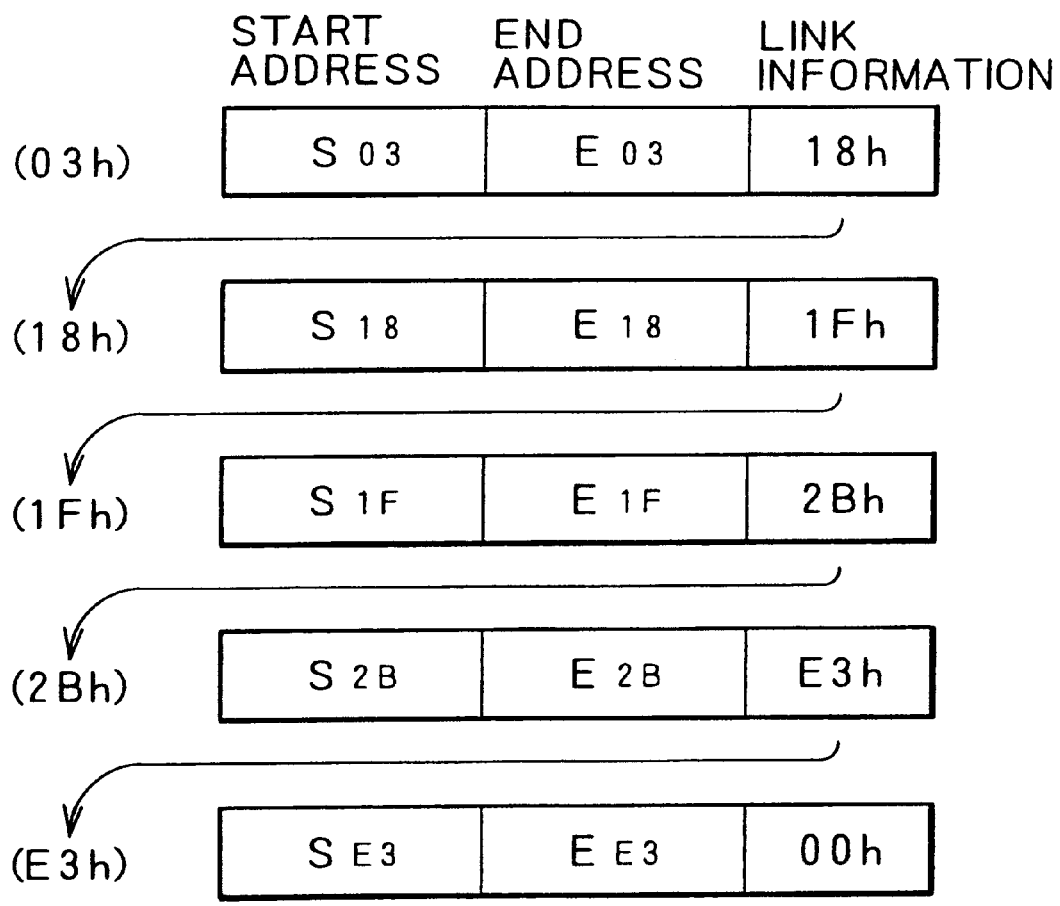
FIG. 11 is a diagrammatic view illustrating a form of a link provided by the U-TOC sector 0 of the mini disc system.

A method of linking areas which are present discretely is described with reference to FIG. 11 using the pointer P-FRA for management of recordable areas as an example.

If it is assumed that, for example, a value 03h (hexadecimal) is recorded in the pointer P-FRA indicating the top position of a slot for management of a recordable area, then the slot corresponding to the value "03h" is accessed. In other words, data of the slot 03h in the management table section is read in.

Data of the start address and the end address recorded in the slot 03h indicate a start point and an end point of one part recorded on the disk.

The link information recorded in the slot 03h indicates an address of a slot to follow the slot 03h. In the case of FIG. 11, 18h is recorded as the link information in the slot 03h.

Then, the link information recorded in the slot 18h is traced to access the slot 2Bh, and a start address and an end address recorded in the slot 2Bh are grasped as a start point and an end point of one part of the disk.

Further, link information is successively traced until data of "00h" appears as the link information. Consequently, the addresses of all parts managed beginning with the pointer P-FRA can be grasped.

By successively tracing slots until the link information of null (=00h) is detected beginning with a slot indicated by the pointer P-FRA in this manner, parts recorded discretely on the disk can be linked on the memory. Consequently, all parts as recordable areas on the magneto-optical disk 90 can be grasped.

While the foregoing description is given taking the pointer P-FRA as an example, also the pointers P-DFA, P-EMPTY, P-TNO1, P-TNO2, ..., P-TNO255 are used to similarly link and manage parts which are present discretely on the disk.

A format of the U-TOC sector 1 is shown in FIG. 12.

In the U-TOC sector 1, character information corresponding to programs stored in the program area and character information (for example, a disc title) corresponding to the entire magneto-optical disk 90 are managed.

The disc title is, where programs recorded are audio data, information of an album title, a name of a player and so forth, and the character information corresponding to the programs is, for example, titles of tunes. Such character information is inputted and registered as characters set arbitrarily by a user.

The character information of each program is recorded in a slot in a character table indicated by a pointer P-TNA(x) (x is one of values 1 to 255) of correspondence table indication data. Character information of 7 bytes can be recorded in one slot. However, where the number of characters is larger, the character information can be recorded in a plurality of slots linked with link information.

Further, in the U-TOC sector 2, recording dates/hours of the individual programs recorded in the program area are managed in a similar form.

Further, in the U-TOC sector 4, katakana characters and kanji characters are managed in a similar manner as in FIG. 12 so that they can be used as a font of the character information of the titles of the programs recorded in the program area, the title of the entire magneto-optical disk and so forth.

3-4. Construction of the CD Player

Subsequently, a construction of a CD player 30 which serves as the reproduction side apparatus of the dubbing system of the present embodiment is described with reference to FIG. 13.

Figure 13:
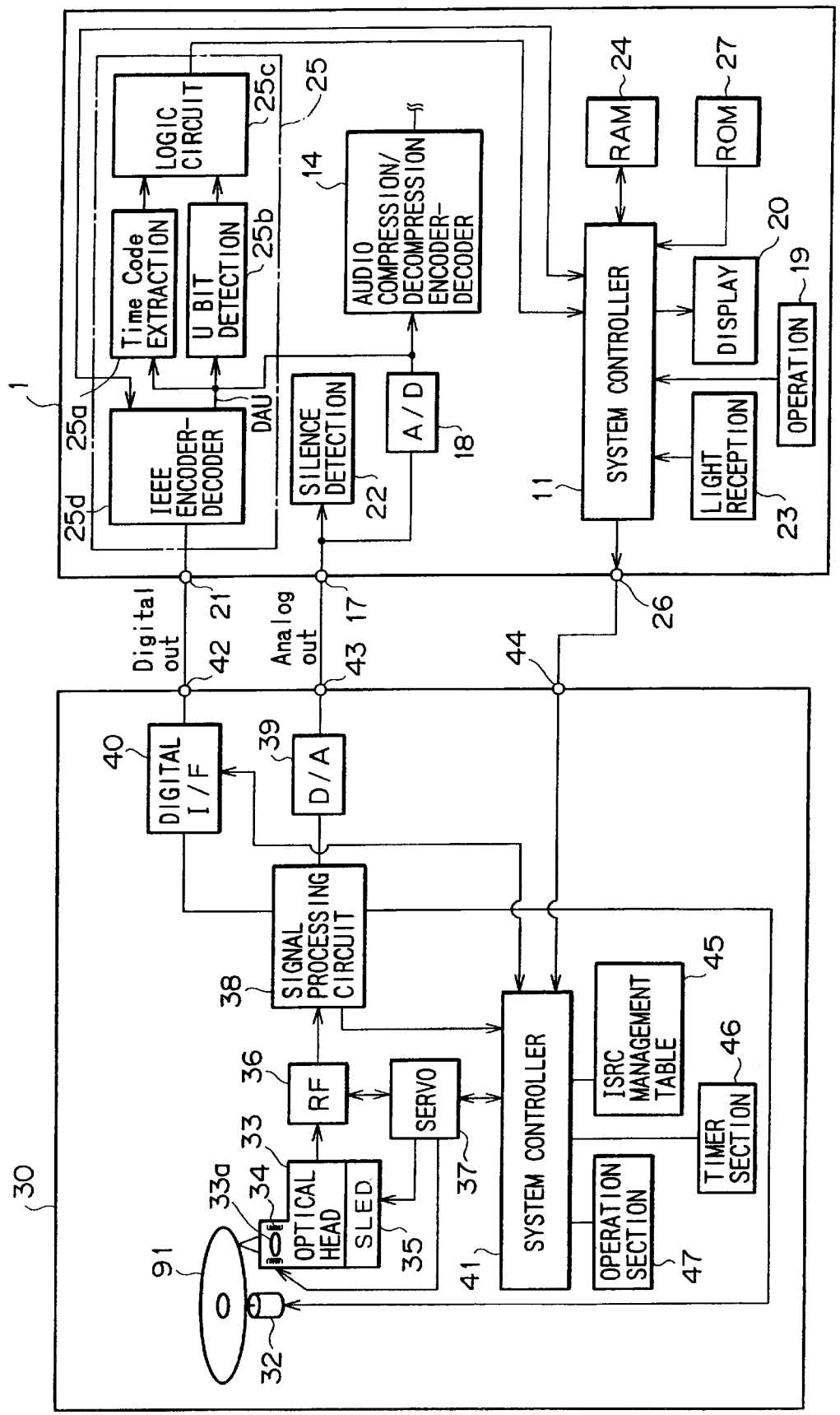
FIG. 13 is a block diagram showing an example of an internal construction of a reproduction apparatus in the form of a CD player which composes the dubbing system to which the present invention is applied.

It is to be noted that, in FIG. 13, as a construction of the CD-MD dubbing system of the present embodiment, some blocks of the MD recorder/player 1 are shown in order to indicate a relationship between the MD recorder/player 1 and the CD player 30. Further, description of those elements whose description is given hereinabove with reference to FIG. 8 is omitted here.

In the dubbing system, audio data reproduced by the CD player 30 can be recorded in a unit of a track (program) onto the disk (MD) 90 on the MD recorder/player 1 side.

The dubbing system may have such a form that the CD player 30 and the MD recorder/player 1 are formed as separate units and can communicate a signal therebetween by a cable or the like or may alternatively have a form of a complex apparatus which has a component as the CD player 30 and another component as the MD recorder/player 1 in a single unit.

In the CD player 30 as a reproduction side apparatus, an optical disc (CD: compact disc) 91 is controlled to be driven to rotate at a CLV (constant linear velocity) by a spindle motor 32.

An optical head 33 includes an objective lens 33a and a two-axis mechanism 34 as well as a semiconductor laser not shown and a light reception section not shown for receiving light emitted from the semiconductor laser and reflected from the surface of the optical disc 91.

The two-axis mechanism 34 includes a focusing coil for driving the objective lens 33a in a direction toward and away from the optical disc 91, and a tracking coil for driving the objective lens 33a in a radial direction of the optical disc 91.

Further, the entire optical head 33 can be moved over a great distance in a radial direction of the optical disc 91 by a sled mechanism 35.

Information of reflected light detected by the light reception section in the optical head 33 is supplied to a RF amplifier.36. The RF amplifier 36 performs current to voltage conversion and matrix arithmetic processing for the reflected light information to produce a focusing error signal FE and a tracking error signal TE as well as a RF signal.

The RF signal as a reproduction signal is extracted as light amount information when the semiconductor laser irradiates a laser beam upon the optical disc 91.

The focusing error signal FE and the tracking error signal TE produced by the RF amplifier 36 are subject to phase compensation and gain adjustment by a servo circuit 37 and then applied to the focusing coil and the tracking coil of the two-axis mechanism 34 through respective drive amplifiers (not shown).

Further, a sled error signal is produced from the tracking error signal TE by a LPF (low pass filter) in the servo circuit 37 and applied to the sled mechanism 35 through a sled drive amplifier (not shown).

Meanwhile, the RF signal produced by the RF amplifier 36 is subject to binary digitization, EFM demodulation and CIRC error correction processing by a signal processing circuit 38. As a result, a digital audio signal as reproduction data is extracted from the RF signal.

The signal processing circuit 38 further produces a spindle error signal for controlling rotation of the optical disc 91 based on the binary digitized EFM signal and applies the spindle error signal to the spindle motor 32.

Furthermore, a PLL (phase locked loop) in the signal processing circuit 38 operates based on the binary digitized EFM signal to generate a reproduction clock signal.

Operation of the servo circuit 37 and the signal processing circuit 38 is controlled by a system controller 41.

A digital audio signal outputted from the signal processing circuit 38 is converted into digital transmission data of a predetermined transmission format, in which control codes and error correction codes are added to the digital audio signal, in order to allow transmission thereof. The digital transmission data is transmitted from an output terminal 42. The transmission data is supplied to the digital interface section 25 of the MD recorder/player 1 through the input terminal 21 of the MD recorder/player 1.

Here, although the specifications of the digital transmission format with which a digital interface section 40 on the CD player 30 side and the digital interface section 25 on the MD recorder/player 1 side comply are not specifically limited in the present invention, it is assumed that the IEEE 1394 is adopted as described hereinabove.

Where the IEEE 1394 interface is adopted, since, for example, control signals between different apparatus can be transmitted through the digital interface section 25 between the digital interface section 40 on the CD player 30 side and the digital interface section 25 on the MD recorder/player 1 side, components for performing communication of control signals between a terminal 44 (on the CD player 30 side) and the terminal 26 (on the MD recorder/player 1 side) can be omitted.

On the other hand, where an alternative construction wherein, for example, digital data are transmitted in the form of an optical signal in accordance with a digital audio interface using an optical communication cable or the like is employed, components for mutual communication through the terminal 44 and the terminal 26 are required for communication of control signals.

A digital audio signal outputted from the signal processing circuit 38 is supplied also to a D/A converter 39. The D/A converter 39 converts the inputted digital audio signal into an analog audio signal and supplies the resulting analog audio signal from an output terminal 43 to the input terminal 17 of the MD recorder/player 1.

An operation section 47 has various keys provided thereon in order that a user may control at least operations of the CD player 30 such as various reproduction operations. The operation section 47 outputs a command signal corresponding to a key operation to the system controller 41.

It is to be noted that, depending upon the system construction, a predetermined operation section for allowing control of the MD recorder/player 1 may be provided on the CD player 30. If an operation is performed for the operation section for the MD recorder/player 1, then a command signal is transmitted to the system controller 11 of the MD recorder/player 1 side under the control of the system controller 41.

The system controller 41 of the CD player 30 executes control processing for the various circuit sections in the CD player 30 in order for the CD player 30 to execute various reproduction operations. Also control processing for causing an operation according to a command received from the operation section 47 to be performed is included in the control processing of the system controller 41.

Further, in the CD player 30 shown in FIG. 13, a timer section 46 and an ISRC management table 45 are provided for the system controller 41. The timer section 46 and the ISRC management table 45 are used for recording limitation of a tune (track) upon high speed dubbing of the dubbing system of the present embodiment, which is hereinafter described, and have similar functions to those of the timer section 28 and the ISRC management table 29 provided in the MD recorder/player 1 described hereinabove with reference to FIG. 8.

However, as hereinafter described as a first example, where recording limitation of a tune (track) upon high speed dubbing is performed utilizing the timer section 28 and the ISRC management table 29 provided in the MD recorder/player 1, the timer section 46 and the ISRC management table 45 of the CD player 30 may be omitted. Further, as hereinafter described as a second example, where limitation of a reproduction tune (track) is performed on the CD player 30 side, the timer section 46 and the ISRC management table 45 are required. Accordingly, in the second example, the timer section 28 and the ISRC management table 29 of the MD recorder/player 1 may be omitted.

Further, upon dubbing operation, the MD recorder/player 1 which serves as the recording apparatus side performs processing of recording a digital audio signal or an analog audio signal transmitted thereto from the CD player 30 onto the magneto-optical disk 90.

In order to record an analog audio signal supplied to the input terminal 17 onto the magneto-optical disk 90, the analog audio signal is converted into a digital audio signal by the A/D converter 18 and inputted to the audio compression encoder-decompression decoder 14 as described hereinabove with reference to FIG. 8. Then, such recording processing as described hereinabove with reference to FIG. 8 is performed.

In this instance, the analog audio signal supplied to the input terminal 17 is supplied also to the silence detection section 22, by which a silence condition as an audio level for more than a predetermined time (for example, approximately 2 seconds) is performed. A resulting detection signal is supplied as information indicative of a change of a program of the supplied analog audio signal to the system controller 11.

While an ordinary CD has a silence portion of approximately 3 to 5 seconds provided between tunes, the silence detection section 22 detects such a silence portion as just mentioned to detect a change of the program number.

On the other hand, where digital transmission data is supplied to the input terminal 21, the digital interface section 25 processes the digital transmission data.

Here, the digital interface section 25 which complies with the IEEE 1394 interface described hereinabove includes, for example, as shown in FIG. 13, an IEEE encoder/decoder block 25d, a time code extraction section 25a, a U bit extraction section 25b and a logic circuit 25c.

Reproduction digital audio data which has been encoded by the digital interface section 40 of the CD player 30 side in accordance with the specifications of the IEEE 1394 interface and transmitted from the CD player 30 are first received by the IEEE encoder/decoder block 25d in the digital interface section 25. The IEEE encoder/decoder block 25d performs decoding processing for the received data to extract digital audio data DAU including sub codes and supplies the digital audio data DAU to the U bit extraction section 25b and the time code extraction section 25a.

It is to be noted that, if the received data includes required data other than digital data of commands for remote control and so forth, then the IEEE encoder/decoder block 25d is controlled to transmit the data to the system controller 11.

The U bit extraction section 25b extracts U bit data which is a flag indicating a change of a program (a change of a tune) from the digital audio signal inputted thereto. Meanwhile, the time code extraction section 25a extracts time code data representative of a reproduction elapsed time from the digital audio signal inputted thereto.

The logic circuit 25c performs logical arithmetic of outputs of the U bit extraction section 25b and the time code extraction section 25a. The logic circuit 25c produces a signal representative of a change of a program of the digital audio signal transmitted from the reproduction side from outputs of the U bit extraction section 25b and the time code extraction section 25a and supplies the thus produced signal to the system controller 11.

While a play elapsed time of each program is extracted from received digital data by the time code extraction section 25a, the logic circuit 25c can perform logical operation of the fact that the play elapsed time becomes −00 minute 01 second and change information of the U bit to produce a detection signal of a program change and so forth.

It is to be noted that a detection signal of a program change may be produced using only a detection result of the U bit extraction section 25b or logical operation between change information of the U bit and a result of silence detection performed as in analog recording.

A digital audio signal transmitted is inputted from the digital interface section 25 to the audio compression encoder-decompression decoder 14, by which recording processing described hereinabove with reference to FIG. 8 is performed.

It is to be noted that the construction of the digital interface section 25 which is compliant with the IEEE 1394 interface shown in FIG. 13 is a mere example and also some other constructions are possible.

For example, where the IEEE 1394 interface is adopted, the format of the digital audio interface described hereinabove with reference to FIGS. 5A, 5B, 6 and 7 need not necessarily be adopted, and for example, it is possible to convert sub code information decoded on the transmission side into a command which conforms with the IEEE 1394 interface and transmit the command and to construct the reception side so that it can process in response to the command.

It is to be noted here that, for the convenience of description, it is assumed that the IEEE 1394 interface is adopted to transmit digital audio data in accordance with the format of the digital audio interface described hereinabove with reference to FIGS. 5A, 5B, 6 and 7.

The CD-MD dubbing system of the present embodiment described above allows standard speed dubbing wherein audio data reproduced on the CD player 30 side at the standard speed is recorded on the MD recorder/player 1 side.

Also high speed dubbing wherein audio data reproduced at a predetermined multiple speed higher than the standard speed on the CD player 30 side are recorded on the MD recorder/player 1 side is permitted.

In standard speed dubbing, the CD player 30 drives the CD 91 to rotate by CLV control of the standard speed to perform reading out of data from the CD 91, performs reproduction signal processing at a processing rate (clock frequency) corresponding to the standard speed and outputs a resulting signal to the MD recorder/player 1, for example, through the digital interface. On the other hand, where an analog audio signal should be outputted, digital audio data is converted into an analog signal at a processing rate corresponding to the standard rate by the D/A converter 39, and the analog signal is outputted.

The MD recorder/player 1 performs signal processing for the input signal such as compression processing (which includes, where digital audio data is inputted as an analog signal, A/D conversion processing) at a processing rate (clock frequency), for example, corresponding to the standard speed. Further, the MD recorder/player 1 performs writing of the data into the buffer memory 13 at a transfer rate of 0.3 Mbit/sec. Further, the MD recorder/player 1 performs reading out from the buffer memory 13 at another transfer rate of 1.4 Mbit/sec in response to the stored amount in the buffer memory 13 and performs writing of the data onto the MD 90, for example, for each one cluster.

On the other hand, when high speed dubbing is to be performed, the CD player 30 sets a predetermined multiple speed higher than the standard speed, drives the CD 91 to rotate at the thus set multiple speed to perform reading out of data from the CD 91, performs reproduction signal processing at a processing rate corresponding to the set multiple speed and outputs a resulting signal to the MD recorder/player 1, for example, through the digital interface.

The MD recorder/player 1 performs signal processing such as compression processing (which includes, when an analog signal is inputted, A/D conversion processing) for the input signal at a processing rate, for example, corresponding to the set multiple speed. Then, where the multiple value of the multiple speed is represented by N, the MD recorder/player 1 performs writing of data into the buffer memory 13 at a transfer rate of 0.3×N Mbit/sec. Then, the MD recorder/player 1 is controlled to read out from the buffer memory 13 in response to the stored amount of the buffer memory 13 and performs writing of data onto the MD 90, in this instance, for example, for each one cluster.

It is to be noted that the readout rate from the buffer memory 13 upon high speed dubbing is different depending upon the set multiple speed.

In particular, if the multiple speed is comparatively low and 1.4 Mbit/sec which is a transfer rate upon reading out is sufficiently high with respect to the transfer rate of 0.3×N Mbit/sec, then reading out of data and writing onto the MD 90 may be performed at the rate of 1.4 Mbit/sec. On the contrary, if the multiple speed is comparatively high and 1.4 Mbit/sec of the transfer rate upon reading out is not sufficiently high or is low with respect to the transfer rate of 0.3×N Mbit/sec, then a readout rate from the buffer memory 13 higher than the readout rate and a rotational driving speed of the MD 90 corresponding to it should be set.

In the present embodiment, ordinary standard speed dubbing and high speed dubbing at a predetermined multiple speed are allowed in this manner.

As control therefor, the system controller 41 of the CD player 30 variably controls the setting of the disk rotational driving speed of the CD player 30 and the clock frequency of the reproduction signal processing system while the system controller 11 of the MD recorder/player 1 variably controls the setting of the clock frequency (if necessary, the disk rotational driving speed) of the reproduction signal processing system of the MD recorder/player 1. Further, if the system controller 41 and the system controller 11 are defined so that they can communicate commands/responses, for example, for instruction of a dubbing speed through the digital interface, then also such operations as switching of the setting between standard speed dubbing and high speed dubbing, synchronous reproduction or recording can be realized readily.

4. Limitation Operation upon High Speed Dubbing 4-1. First Example

As can be recognized from the foregoing description, in the present embodiment, high speed dubbing at a predetermined multiple speed is possible. However, as described hereinabove in connection with the prior art, if a user frequently performs high speed dubbing of the same CD or the same tune (track), there is the possibility that this may exceed the normal range of private use and may infringe upon the copyright.

Therefore, in the MD-CD dubbing system of the present embodiment, limitation is provided to high speed dubbing in a unit of a tune (track) of an object of recording in such a manner as described below to achieve protection of the copyright. First, an outline of this is described in connection with a first example.

An outline of operation of the first example is such as follows.

In the first example, the timer section 28 and the ISRC management table 29 provided in the MD recorder/player 1 are used. Further, in high speed dubbing in this instance, audio information may be outputted from the CD player 30 to the MD recorder/player 1 in any of the digital and analog forms. However, in order to facilitate detection of an ISRC on the MD recorder/player 1 side as hereinafter described, it is assumed that the system is so constructed that at least sub coding data is inputted through the digital interface to the MD recorder/player 1 in synchronism with a reproduction output of digital audio data.

While Q channel data illustrated in FIGS. 3A, 3B and 3C is sub coded in audio data reproduced from a CD, where high speed digital dubbing is performed by the MDCD dubbing system of the present embodiment, since also the Q channel data is transmitted to the MD recorder/player 1 side together with audio data, the MD recorder/player 1 side can identify the contents of the Q channel data.

Therefore, the MD recorder/player 1 is constructed such that, if high speed dubbing of a tune of a certain track is started, then an ISRC of the mode 3 illustrated in FIG. 3C is detected as Q channel data to be obtained then.

If the system controller 11 of the MD recorder/player 1 detects an ISRC, then if the ISRC does not coincide with any one of ISRCs currently stored in the ISRC management table 29, then this ISRC is stored into the ISRC management table 29. The ISRC management table 29 has such a structure as shown, for example, in FIG. 14.

Here, it is assumed that the timer section 28 has a predetermined plurality of timers provided therein. Then, if the system controller 11 stores an ISRC newly into the ISRC management table 29 in such a manner as described hereinabove, then the timer section 28 selects one of those timers which are not in use then and activates the selected timer. The timers of the timer section 28 have a predetermined timer time set uniformly therein, and if one of the timers is activated under the control of the system controller 11, then it operates to count the time so that the time count may, for example, be successively decremented from 74 minutes after the point of time of the activation (or may alternatively be successively incremented from 0 minute up to 74 minutes).

Figures 14, 15:
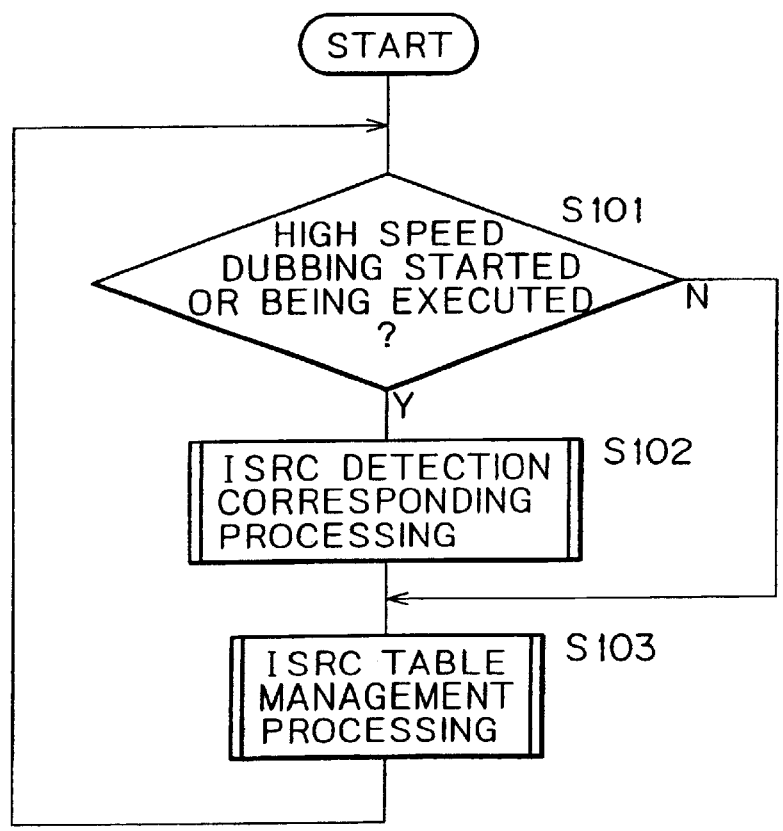
FIG. 14 is a diagrammatic view illustrating an example of a construction of an ISRC management table.
FIG. 15 is a flow chart illustrating processing operation for realizing a high speed dubbing controlling operation of the dubbing system to which the present invention is applied.

The ISRC management table 29 holds the ISRC stored newly in such a manner as described above and a timer ID provided to the activated timer in a corresponding relationship in such a manner as seen in FIG. 14 so that a correspondence between the ISRC stored newly and the activated timer may be obtained.

The ISRC management table 29 includes a management table in which such ISRCs and timer IDs are stored in a corresponding relationship such that, for example, a timer of the timer section 28 is provided in a corresponding relationship to each ISRC.

If a timer corresponding to an ISRC stored in the ISRC management table 29 counts to 0 as a result of lapse of time of 74 minutes, then the ISRC and information of the timer ID corresponding to the ISRC are cleared and deleted from the ISRC management table 29 under the control of the system controller 11.

In the present embodiment, the ISRC management table 29 is produced in this manner.

Here, it is assumed that, when high speed dubbing of a certain track is proceeding, an ISRC same as the ISRC detected by the MD recorder/player 1 side is placed already in the ISRC management table 29.

In this case, the MD recorder/player 1 stops recording of the track whose high speed dubbing is proceeding after the point of time at which the ISRC is detected. In short, the MD recorder/player 1 operates such that it inhibits recording of a track having an ISRC which coincides one of ISRCs placed in the ISRC management table 29.

Upon high speed dubbing, the following time is required after reproduction of a certain tune (track) is started on the CD player side until an ISRC is detected by the system controller 11 on the MD recorder/player 1 side. In particular, if it is assumed that, for example, one ISRC which is Q channel data of the mode 3 is included in 100 sub coding blocks without fail, then because 75 sub coding blocks at the standard speed correspond to substantially one second, one ISRC can be detected substantially with certainty within one second although this depends upon the actual multiple speed.

Since, when a timer time elapses, a corresponding ISRC is cleared in the ISRC management table 29 in such a manner as described above, after the timer time elapses, recording is not inhibited and high speed dubbing of the track having the ISRC can be performed.

In this manner, in the present embodiment, even if high speed dubbing of a track is performed once and then it is tried to perform high speed dubbing of the track again within the timer time described hereinabove (for example, 74 minutes), recording on the MD recorder/player 1 side is stopped at a point of time when an ISRC is detected by the system controller 11. In other words, within a predetermined time corresponding to the timer time, an action of performing high speed dubbing of the track whose high speed dubbing has been performed before is inhibited. Consequently, infringement upon the copyright by duplication of the same track by a large number in a short time is prevented.

While the timer time which corresponds to an inhibition time for high speed dubbing is 74 minutes in the foregoing description, this arises from the following foundation.

The time of 74 minutes is generally known as a maximum recording time length of a CD. Thus, duplication of the same CD (that is, all tunes (tracks) included in one CD) is prevented from being performed twice or more times by high speed dubbing within a unit time (which is 74 minutes in the maximum) required for dubbing of one CD at the standard speed). As a result, only a dubbing efficiency equal to that when dubbing of a CD is performed at the standard speed is obtained.

For example, if the inhibition time is such as just described, although this effectively functions to a user who performs duplication of a tune by high speed dubbing exceeding a range of private use while no considerable inconvenience is felt by an ordinary user who performs dubbing without exceeding private use.

However, naturally the timer time (inhibition time of high speed dubbing) is not limited to the time of 74 minutes specified above, and another time longer or shorter than this may be set taking an actual condition of use, a copyright protection effect and so forth into consideration.

If it is considered that the average play time of one track is approximately 3 minutes, then it is a possible idea, for example, to set 3 minutes, which is the play time of one track, as the timer time.

Further, the number of timers to be actually prepared in the timer section 28 can be set in the following manner.

Here, it is assumed that, as conditions, high speed dubbing is performed at a quadruple speed and the play time of one tune (one track) is 180 seconds (=3 minutes).

In this case, the time required to record one track by high speed dubbing at a quadruple speed is as follows:

180/4=45 (seconds)

Then, where the timer time is 74 minutes as described above, the maximum number of tracks which can be recorded within a real time of 74 seconds (=4,440 seconds) until a timer activated first is reset to cancel the inhibition is 98 as given by this:

4,4440/45=98

Accordingly, if a number of timers around 98 (for example, 100 timers) are provided in the timer section 28, then even if different tracks are successively dubbed at a high speed, some usable timers always remain, and such a situation as shortage of timers can be prevented almost with certainty.

However, for example, if the play time of one track is so short that all timers are brought into use before 74 minutes elapse from since activation of a first timer and no unused timer remains any more, the CD-MD dubbing system of the present embodiment is controlled so that later high speed dubbing itself is inhibited. Then, after a certain time elapses, the timer time expires with the timers beginning with the timer which was activated first and the ISRC management table 29 is cleared to restore a condition wherein unused timers are present in the ISRC management table 29. Consequently, a condition wherein high speed dubbing is possible is restored.

Subsequently, processing operation for realizing a track recording limitation operation upon high speed dubbing in the first example described above is described with reference to flow charts of FIGS. 15, 16 and 17. The processing operation is executed by the system controller 11 of the MD recorder/player 1.

First, processing illustrated in FIG. 15 is described. The processing illustrated in FIG. 15 is executed steadily, for example, while the MD recorder/player 1 is operating.

Referring to FIG. 15, the system controller 11 discriminates in step S101 whether recording onto the MD 90 by high speed dubbing is started or high speed dubbing operation is proceeding as an operation condition when the processing of the system controller 11 returns to step S101 after processing in step S103 which is hereinafter described is completed.

If it is discriminated here that high speed dubbing is proceeding, then the processing in steps S102 and S103 is executed. On the other hand, if, for example, dubbing operation at the standard speed is proceeding or operation other than dubbing recording operation such as stopping or reproduction, then a negative discrimination result is obtained in step S101. In this case, the processing in step S102 is skipped and the processing in step S103 is performed immediately.

The processing in step S102 is ISRC detection corresponding processing which is executed while high speed dubbing operation is proceeding. In particular, processing for producing the ISRC management table 29 (including activation of a timer) based on an ISRC detected from digital audio data reproduced by the CD player 30 and inputted to the MD recorder/player 1 as described hereinabove, or controlling processing for limiting recording of a track, is executed.

The processing in step S103 s ISRC table management processing. In particular, the processing in step S103 is processing for clearing an ISRC, which is currently stored in the ISRC management table 29 and corresponds to a timer whose timer time becomes equal to 0 as a result of execution of counting down after it was activated in response to the ISRC as described hereinabove, from the ISRC management table 29.

The ISRC detection corresponding processing in step S102 described above is particularly such as illustrated in FIG. 16. The processing operation illustrated in FIG. 16 is executed by the system controller 11 of the MD recorder/player 1.

Figure 16:
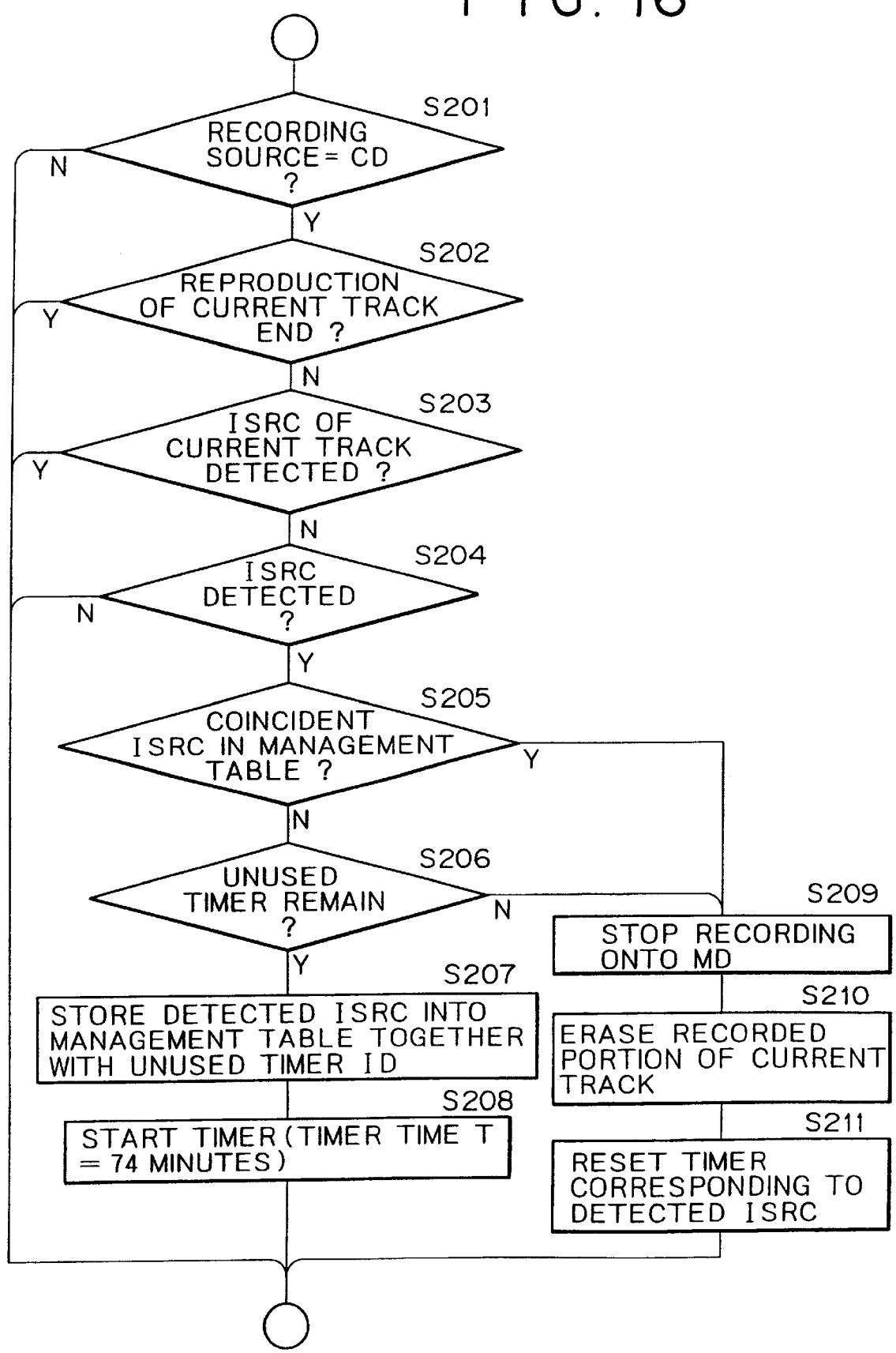
FIG. 16 is a flow chart illustrating ISRC corresponding processing in the processing operation illustrated in FIG. 15.

Referring to FIG. 16, it is discriminated first in step S201 whether or not a recording sound source currently inputted as recording data to be dubbed at a high speed is reproduction from a CD.

For the discrimination, the system controller 11 should discriminate contents of the second bit Q2 of the control data CTL (Q1 to Q4) illustrated in FIGS. 3A, 3B and 3C as contents of sub coding data of the Q channel included in digital audio data being inputted at present. In short, the system controller 11 is required only to discriminate whether or not the control data CTL (Q1 to Q4) is "*0**" (CD-DA (CD digital audio)).

In the present embodiment, if it is discriminated in step S201 that the recording source is not a CD, then later processing illustrated in FIG. 16 is not executed, but the system controller 11 advances its processing to step S103 shown in FIG. 15. On the other hand, if it is discriminated that the recording source is a CD, then the processing advances to step S202.

In step S202, it is discriminated, for example, whether or not reproduction of a track (current track) which has been reproduced till now comes to an end. This discrimination processing can be performed, for example, by detecting a change of the value TNO in the Q channel data of the mode 1 inserted in the digital audio data being inputted (refer to FIG. 3A).

Here, if it is discriminated that reproduction of the current track comes to an end, then the processing advances to step S103. However, if it is discriminated that the reproduction of the current track does not come to an end, then the processing advances to step S203.

In step S203, it is discriminated whether or not an ISRC has already been detected from among audio data of the track (current track) being reproduced at present by processing in steps S204 et seq. which are hereinafter described. To this end, for example, the system controller 11 may set a flag when an ISRC is detected once from within the current track and hold the flag, for example, in the RAM 24. The flag is cleared when an affirmative result is obtained in step S202 described above.

Then, if a negative result is obtained in step S203, then the processing advances to step S204, in which the system controller 11 supervises contents of sub coding data of the Q channel inserted in the audio data of the current track to detect an ISRC (channel data of the mode 3 (refer to FIG. 3C)). If no ISRC is detected here, then the processing advances to step S103. However, if an ISRC is detected, then, for example, the detected ISRC is stored and the processing advances to step S205.

In step S205, the ISRC detected in step S204 and contents of the ISRC management table 29 at present are referred to to discriminate whether or not one of ISRCs stored in the ISRC management table 29 coincides with the detected ISRC.

If a negative result (which corresponds to a case wherein the track same as the current track was dubbed at a high speed within the timer time (74 minutes) retrospectively from the current point of time) is obtained, then the processing advances to step S206. However, if an affirmative result (which corresponds to a case wherein the track same as the current track was not dubbed at a high speed within the timer time (74 minutes) retrospectively from the current point of time) is obtained, then the processing is controlled to advance to step S209.

In step S206, it is discriminated whether or not there remains, in the timer section 28, a timer which is unused at present.

If it is discriminated here that a timer which is unused at present remains in the timer section 28, then the processing advances to step S207.

On the contrary if it is discriminated that a timer which is unused at present does not remain in the timer section 28, then the processing advances to step S209.

In step S207, one of those timers which are unused in the timer section 28 is selected, and a timer ID of the thus selected timer and the ISRC detected in step S204 described above are stored into the unused area of the ISRC management table.

Then in next step S208, the timer selected in step S206 described above is activated. Thereafter, the timer starts its counting down operation, for example, from the timer time T=74 minutes by processing in step S103 which is hereinafter described.

The activation timing of the timer in step S208 is selected in the following manner. In particular, according to the present processing operation, the timer is activated at a time substantially corresponding to a point of time when it is discriminated that an ISRC which coincides with the ISRC detected from reproduction audio data is stored in the ISRC management table 29. Although such an activation timing of the timer as just described may be used in the present embodiment, the timer may otherwise be activated at a timing corresponding to, for example, a point of time when recording of the current track comes to an end. In this instance, as a result, if the timer time does not elapse after a point of time at which recording of the current track comes to an end, the same track as the current track cannot be dubbed at a high speed.

After the processing in step S208 described above is completed, the processing advances to step S103.

On the other hand, if an affirmative result is obtained in step S205 or a negative result is obtained in step S206, then the processing advances to step S209. In step S209, the system controller 11 executes control processing for stopping recording onto the magneto-optical disk 90. In particular, since the same track as the current track was dubbed at a high speed within 74 minutes, the system controller 11 controls so as to inhibit recording of the current track.

In a stage in which the processing in step S209 comes to an end, part of audio data of the current track is recorded on the MD 90. The data of the track recorded but incompletely in this manner is preferably deleted, for example, taking the convenience in use of an ordinary user, protection of the copyright and so forth into consideration.

Therefore, in the present embodiment, processing for erasing a recorded portion of the current track recorded on the MD 90 till then is executed in next step S210. This may be, in the present embodiment, to write the U-TOC sector 0 of the magneto-optical disk 90 loaded at present so that the recording area of the current track recorded till then may be managed as a free area.

In this instance, processing for resetting the timer time of the timer which corresponds to the ISRC of the ISRC management table 29, which has been detected to coincide with the detected ISRC in step S205, to T=74 minutes is executed in next step S211. The processing in step S211 provides an operation like a penalty for an action of a user who tries to perform high speed dubbing of the same track by two times or more within 74 minutes.

After the processing in step S211 is completed, the system controller 11 advances its processing to step S103.

It is to be noted that the processing in step S206 of discriminating whether or not there remains an unused timer may be executed in a stage immediately before recording and reproduction for high speed dubbing are actually started or at a timing at which a track is changed. In this instance, if an affirmative discrimination result is obtained, then recording can be stopped before starting of high speed dubbing or before dubbing of a new track.

Figure 17:
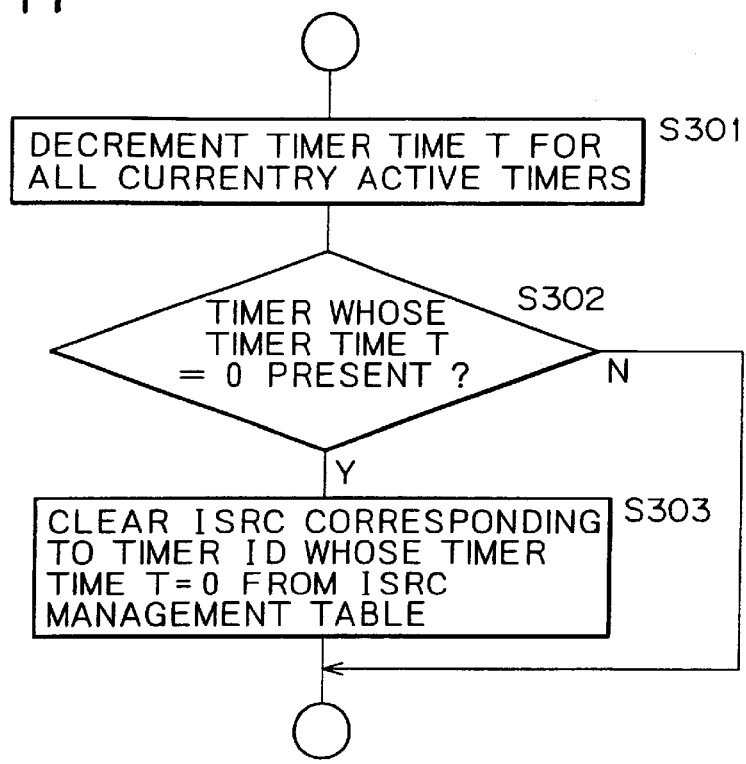
FIG. 17 is a flow chart illustrating management processing of an ISRC management table in the processing operation illustrated in FIG. 15.

The ISRC table management processing in step S103 illustrated in FIG. 15 is actually executed in such a manner as illustrated in the flow chart of FIG. 17.

In the processing illustrated in FIG. 17, counting down (decrementing) of the timer time is performed for all of those of the timers prepared in the timer section 28 which are operating (in use) at present first in step S301.

Thereafter, the processing advances to step S302, in which it is discriminated whether any of the timers for which decrementing has been performed in step S301 described above exhibits the timer time T=0, that is, whether or not there is a timer with which the timer time has expired.

If it is discriminated in step S302 that there is no timer whose timer time T is T=0, then the processing illustrated in FIG. 17 (that is, in step S103) is ended immediately and the processing returns to step S101 illustrated in FIG. 15.

On the other hand, if it is discriminated in step S302 that there is a timer whose timer time T is T=0, then the processing advances to step S303.

In step S303, the ISRC stored corresponding to the timer ID of the timer whose timer time T has been discriminated to be T=0 in step S202 described above is cleared from the ISRC management table. Consequently, of the tracks for which high speed dubbing has been performed formerly, that one with which the timer time T=74 minutes has elapsed is permitted for high speed dubbing.

After the processing in step S303 is completed, the processing returns to step S101 of FIG. 15.

As the processing illustrated in FIGS. 15, 16 and 17 is executed in such a manner as described above, an operation of inhibiting an action of high speed dubbing the same track again within a predetermined time corresponding to the timer time is realized.

Further, in the present embodiment, the MD recorder/player 1 is controlled in step S101 of FIG. 15 so that, in any other operation than high speed dubbing, it does not execute the ISRC detection corresponding processing in step S102. Consequently, when, for example, dubbing at the standard speed is to be performed, it is permitted to dub the same track by a plural number of times irrespective of the timer time.

This is because inhibition of high speed dubbing in the present embodiment is performed in order to prevent a tune of the same track from being copied more efficiently by high speed dubbing than by standard speed dubbing. Conversely speaking, for example, if standard speed dubbing is selected, then the same track can be dubbed successively. In this regard, attention is paid so that the convenience in use to an ordinary user may not be deteriorated.

It is to be noted that, since the present embodiment is so constructed that audio data of the same track may not be duplicated by high speed dubbing within a certain predetermined time, the particular method for inhibiting high speed dubbing is not limited to such a method of inhibiting recording onto an MD as described in connection with step S209 of FIG. 16. For example, also it is a possible idea to cause an inputting stage of recording sound information to reject inputting thereto so that the recording sound information may not be supplied to the following recording signal processing system even if a recording operation onto an magneto-optical disk 90 is continued. In other words, the digital interface section 25 on the MD recorder/player 1 side does not accept inputting of digital audio data supplied from the CD player 30, or the A/D converter 18 does not perform A/D conversion processing of an analog audio signal supplied from the CD player 30, so that digital data may not be supplied to the decoder 14 in a following stage. Further, as a modification, it is a possible countermeasure to generate stream data like dummy data different from actual audio data and write such dummy data onto an MD 90.

4-2. Second Example

Subsequently, a second example of limitation to track copying upon high speed dubbing in the present embodiment is described.

In the second example, limitation to track reproduction is performed on the CD player 30 side which is the reproduction apparatus of the dubbing system. To this end, in the second example, the CD player 30 side is required to include the timer section 46 and the ISRC management table 45 as described hereinabove. The ISRC management table 45 may be formed in a similar manner as illustrated in FIG. 14.

Operation in the second embodiment is much common to that in the first example and is generally such as follows.

When a reproduction operation of a CD is performed on the CD player 30, for example, at a predetermined multiple speed for high speed dubbing, the system controller 41 detects an ISRC inserted in audio data as a track reproduced from the CD. Then, similarly as in the first example, if the detected ISRC is not found in the ISRC management table 45, then one of the timers of the timer section 46 is activated, and a timer ID of the timer and the detected ISRC are stored into the ISRC management table 45.

On the other hand, if the detected ISRC is stored in the ISRC management table 45, then the system controller 41 controls so that reproduction information of the current track may not be outputted to the MD recorder/player 1. Where the reproduction data from the CD player 30 is prevented from being outputted to the MD recorder/player 1 in this manner, even if a recording operation is executed on the MD recorder/player 1 side, the audio data of the track cannot be recorded onto the MD 90.

Also where the reproduction (CD player 30) side is constructed in such a manner as described above, high speed dubbing of the same track by a plural number of times within a predetermined time corresponding to the timer time is prevented in a similar manner as in the first example.

Subsequently, processing operation executed by the system controller 41 of the CD player 30 in order to realize the operation in the second example is described.

Figure 18:
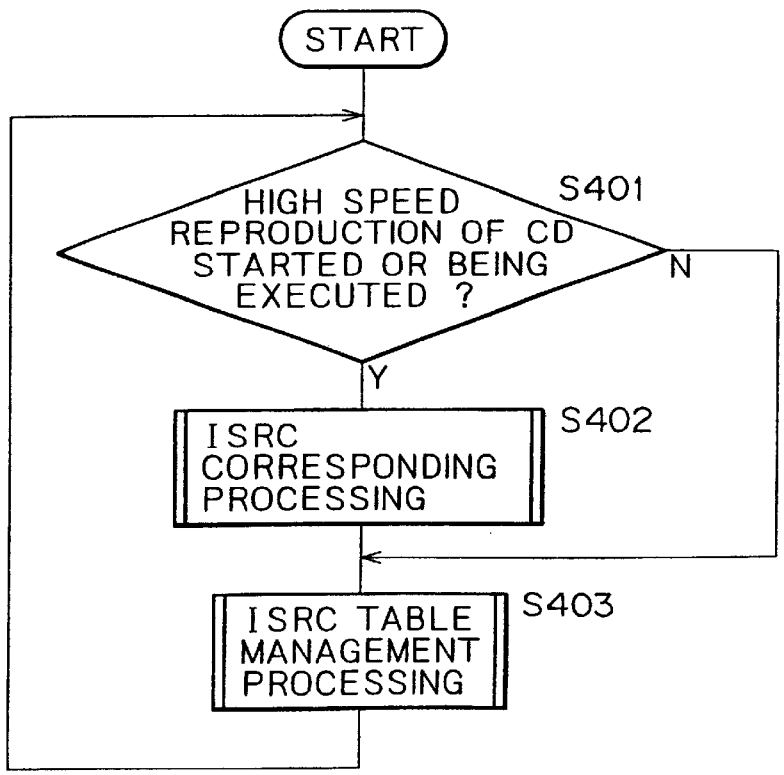
FIG. 18 is a flow chart illustrating high speed dubbing limitation operation of the dubbing system to which the present invention is applied.

A flow chart of FIG. 18 illustrates processing which is executed steadily by the system controller 41 during operation of the CD player 30 in order to realize limitation to track reproduction upon high speed dubbing. The processing illustrated in FIG. 18 corresponds to the processing operation illustrated in FIG. 15 in the first example.

Referring to FIG. 18, playback of a CD at a predetermined multiple speed is performed in step S401. In particular, it is discriminated whether a high speed reproduction operation is started or a high speed reproduction operation is proceeding as an operation condition of the CD player 30 when the processing of the system controller 41 returns to step S401 after the system controller 41 executes processing in step S403.

If it is discriminated here that high speed reproduction is proceeding, then the system controller 41 executes a sequence in steps S402 and S403.

On the other hand, if it is discriminated that, for example, a reproduction operation at the normal standard speed is proceeding or the CD player 30 is in an operation mode other than ordinary reproduction operations such as stopping, fast feeding and rewinding, a negative result is obtained in step S401. In this instance, the processing of the system controller 41 skips step S403 and executes the processing in step S403 immediately.

The processing in step S402 is ISRC detection corresponding processing, and the processing in step S403 is ISRC table management processing.

Figure 19:
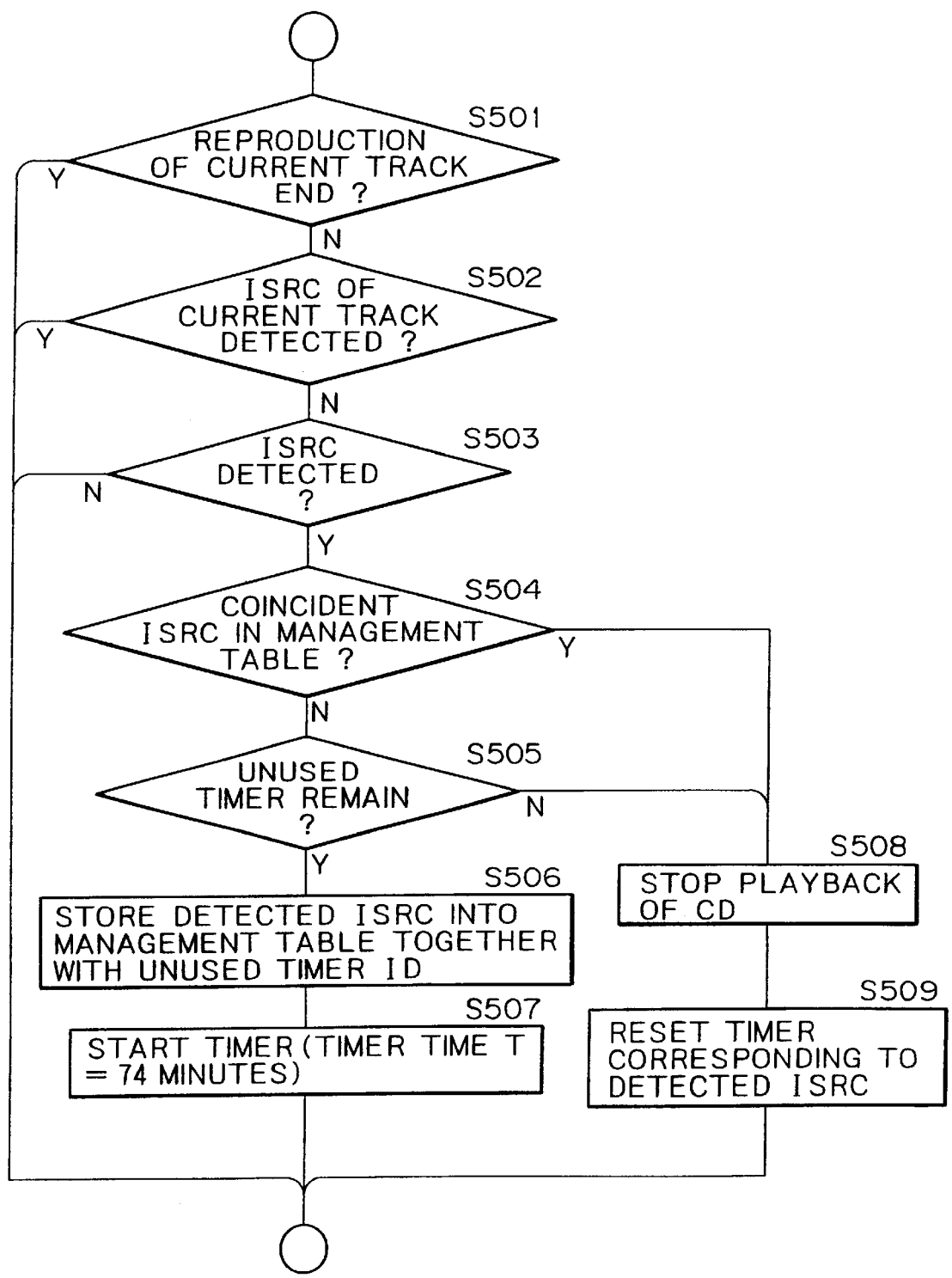
FIG. 19 is a flow chart illustrating ISRC corresponding processing in the processing operation illustrated in FIG. 18.

The ISRC detection corresponding processing in step S402 is particularly such as illustrated in a flow chart of FIG. 19. The processing operation is executed by the system controller 41.

The processing illustrated in FIG. 19 begins with discrimination processing in step S501 of whether or not a current track being reproduced by the CD player 30 comes to an end. However, processing executed in steps S501 to S507 is similar to the processing in steps S202 to S208, respectively, in the ISRC detection corresponding processing in the first example described hereinabove with reference to FIG. 16 except that the present processing is executed by the CD player 30 side. Therefore, overlapping detailed description of the processing is omitted here to avoid redundancy.

In the second example, when it is discriminated in step S504 that an ISRC which coincides with an ISRC detected from reproduction audio data is stored in the ISRC management table 45 or when it is discriminated in step S505 that no unused time remains in the timer section 46, the processing of the system controller 41 advances to step S508.

In this instance, in step S508, the system controller 41 executes controlling processing for stopping the playback of the CD which has been played by the CD player 30. Then in next step S509, the system controller 41 executes controlling processing, for example, for resetting a timer of a timer ID which corresponds to the ISRC which coincides with the ISRC detected in preceding step 503 (for re-starting counting down from the timer time T=74 minutes) in the ISRC management table 45.

After the processing in step S509, the processing of the system controller 41 advances to step S403.

Actual processing in step S403 of FIG. 18 is similar to the processing operation in the first example described hereinabove with reference to FIG. 17 except that the processing is executed in the CD player 30. Therefore, overlapping description of the processing is omitted here to avoid redundancy.

As the processing illustrated in FIGS. 18 and 19 (and FIG. 17) is executed is executed, limitation operation to high speed dubbing by operation on the CD player side is realized.

Here, while the processing in step S508 of FIG. 19 is such that reading out of information from a CD is stopped in order to prevent reproduction audio data from being supplied to the MD recorder/player 1, where it is intended to prevent high speed dubbing from being performed, it is otherwise possible to control so that, while stopping of reproduction of a CD is continued, transmission outputting of audio data from the digital interface section 40 and stopping of outputting of an audio signal from an analog output terminal 43 (for example, to stop outputting of an analog signal from the D/A converter 39 or to render communication between the D/A converter 39 and the analog output terminal 43 open) may be performed.

Further, if the CD-MD dubbing system is constructed such that high speed dubbing is performed only with an output of reproduction audio data in the form of digital data, then also it is a possible countermeasure to stop only transmission outputting of audio data from the digital interface section 40 while an audio signal is outputted from the analog output terminal 43.

On the contrary if the CD-MD dubbing system is constructed such that high speed dubbing is performed only with an analog audio signal, then it is a possible countermeasure to stop only outputting of an audio signal from the analog output terminal 43 while outputting of audio data from the digital interface section 40 is left valid.

Further, the operation in the second example is operation of limiting reproduction of that the same track reproduced by a plural number of times within a predetermined time corresponding to a timer time by the CD player 30 and is operation which completes on the reproduction apparatus side in the form of a CD player.

Accordingly, the operation in the second example can be applied also to a case wherein there is the possibility that the copyright may be infringed upon, for example, even with any other than high speed dubbing by an action itself of performing playback of a CD by means of a CD player.

4-3. Third Example

In the first and second examples described above, an ISRC inserted in audio data is detected and high speed dubbing is inhibited based on the detected ISRC.

Since the object of the present embodiment is to prevent contents of the same track or the same CD from being copied by a plural number of times within a predetermined time corresponding to a timer time, high speed dubbing can be inhibited making use of identification information other than an ISRC if the identification information allows specification of a track or a CD.

Thus, in the third example, high speed dubbing is inhibited utilizing identification information other than an ISRC.

To this end, in the third example, identification information (which is hereinafter referred to as custom file) for identification of a CD serving as a recording sound source is produced and utilized in place of an ISRC. Then, based on the custom file, for example, the same CD is inhibited from being high speed dubbed over a plural number of times within a predetermined time. It is to be noted that, where an ISRC is utilized, high speed dubbing can be inhibited in a unit of a track, since a custom file is identification information for specification of a CD, high speed dubbing inhibition operation is realized in a unit of a CD.

A detailed example of the high speed dubbing inhibition operation employing a custom file in the present embodiment is such as follows.

For example, if a certain compact disc CD is loaded into the CD player 30, then the system controller 41 first reads in TOC information. In a compact disc system, TOC information necessary for a reproduction operation is recorded in a lead-in area of a CD although it has a structure different from the TOC structure of the mini disc system described hereinabove. After a CD is loaded, the system controller 41 first causes the optical head 33 to execute a reproduction operation of the lead-in area and fetches TOC data extracted by the signal processing circuit 38 which includes an EFM decoder. As the TOC data is read in, address information of tracks on the loaded CD can be grasped and reproduction operation control is allowed.

Since contents of such TOC information are unique to each disc, by producing a custom file making use of this, identification of each disk is allowed upon dubbing operation which is hereinafter described.

For the custom file, for example, a disk ID unique to a CD may be used and the value of it may be produced, for example, by a combination of total play time data and the last frame number in the TOC information.

If a unique disc ID is produced in this manner and stored, then when the CD is loaded later, if a disk ID is produced similarly and is compared with the stored disc ID, then the CD can be specified if coincidence is detected.

Further, in the present embodiment, the CD player 30 side produces a disc ID of a loaded CD and stores the disc ID together with a timer ID of an activated timer to produce a disc ID management table. In short, a disc ID management table is prepared in place of the ISRC management table 45 used in the first and second examples.

The CD player 30 is thus controlled such that, each time a CD is loaded newly, a disc ID is produced under the control of the system controller 41 and the disk ID management table is referred to in order to discriminate whether or not a disc ID which coincides with the thus produced disc ID is present in the. disc ID management table. Then, if a disc ID which coincides with the produced disc ID is not found in the disc ID management table, then the produced disc ID is stored into the disc ID management table together with a timer ID of a timer activated newly. On the other hand, if a disc ID which coincides with the disc ID of the loaded CD is found in the disc ID management table, then it is determined that an operation for performing high speed reproduction, for example, for high speed dubbing has been performed, and the system controller 41 controls so that outputting of reproduction sound of the loaded CD may be not be performed.

It is to be noted that, while it is described, in the foregoing description, reproduction outputting on the CD player 30 side is stopped, it is otherwise possible, for example, to construct the CD-MD dubbing system such that, if it is discriminated through communication between the system controller 41 of the CD player 30 and the system controller 11 of the MD recorder/player 1 that a disc ID which coincides with a disc ID of a loaded CD is found in the disk ID management table, then recording of audio data on the MD recorder/player 1 side is inhibited.

Also it is possible to construct the CD-MD dubbing system such that TOC data of a CD loaded into the CD player 30 are fetched into the MD recorder/player 1 side through the digital data interface and a custom file (disc ID) and a disc ID management table are produced on the MD recorder/player 1 side and then management of the disk ID management table and inhibition operation of high speed dubbing based on the disk ID management table and the produced disc ID are executed on the MD recorder/player 1 side.

It is to be noted that the present invention is not limited to the construction of the specific embodiment described above. For example, if information which can be used for identification in a unit of a track or a recording medium other than an ISRC or a custom file is available, then a dubbing system which inhibits high speed dubbing making use of the information can be implemented.

Further, while, in the embodiment described above, a dubbing system which includes an MD recorder/player and a CD player is described, the present invention can be applied also, for example, to another dubbing system which includes a plurality of MD recorder/players, a further dubbing system which includes a recording or reproduction apparatus which is ready for a tape medium such as, for example, a DAT or a tape cassette recorder, or a still further dubbing system which performs dubbing between a hard disk and a semiconductor memory, between semiconductor memories or dubbing using a next generation memory such as a magnetic memory or an optical memory.

As described above, according to the present invention, when high speed dubbing is performed, for example, from a CD (first recording medium, recording medium for reproduction) to an MD (second recording medium, recording medium for recording), a timer for counting a required timer time is activated corresponding to identification information such as an ISRC inserted in an audio signal (reproduction information) reproduced from the CD or a custom file (disc ID) produced from TOC information of the CD. Then, high speed dubbing of reproduction information having an ISRC or a disc ID with which the corresponding timer time does not elapse is inhibited.

In short, in the present invention, reproduction information of the same program (track) or the same CD cannot be dubbed by a plural number of times within a predetermined time corresponding to the timer time.

With the construction described above, a dubbing action which is regarded as exceeding a range of personal use such as to duplicate a recording sound source such as the same tune (track) or the same CD by a large number of times in a short time can be inhibited by taking setting of the timer time suitably into consideration. Consequently, possible infringement upon the copyright by high speed dubbing can be prevented.

Further, with the construction described above, since the high speed dubbing function is not disabled but dubbing of the same track or the same CD is allowed when the time timer described above elapses, good convenience in use to an ordinary user who performs dubbing in the range of ordinary personal use is maintained.

Further, while any one of a technique of inhibiting an operation regarding recording by performing detection of identification information and timer processing on the recording apparatus side and another technique of inhibiting an operation regarding reproduction by performing detection of identification information and timer processing on the reproduction apparatus side can be adopted for the dubbing inhibition operation in the present invention, since the dubbing inhibition operation can be completed by any one of the recording apparatus and the reproduction apparatus, the high speed dubbing limitation function can be realized simply with a dubbing system even if the dubbing system is composed of, for example, a single unit which includes the recording apparatus and the reproduction apparatus.

Further, where an operation for actually inhibiting high speed dubbing should be performed on the reproduction apparatus side, the dubbing system is constructed such that stopping of reading out of reproduction information from the recording medium for reproduction or stopping of outputting of reproduction information read out from the recording medium for reproduction is executed, but where the operation for actually inhibiting high speed dubbing should be performed on the recording apparatus side, the dubbing system is constructed such that stopping of writing of reproduction information onto the recording medium for recording or processing of rejecting acceptance of an input of reproduction information read out from the recording medium for reproduction is executed.

In short, it is only required for the high speed dubbing inhibition operation according to the present invention that a recording medium on which an audio signal is duplicated be not obtained as a consequence, and the high speed dubbing inhibition operation can be selected from among various operations. Consequently, a high speed dubbing inhibition operation which is optimum to an actually implemented dubbing system can be selected, which is advantageous also in system designing.

Further, if information which can be used for identification of a program inserted in reproduction information such as an ISRC is utilized as the identification information in the present invention, a high speed dubbing inhibition operation in a unit of a program can be achieved readily. Further, if a high speed dubbing inhibition operation in a unit of a recording medium is required, then information which can be used for identification of an individual as a recording medium which makes use of TOC information of a disc such as a custom file (disc ID) may be utilized. In short, in the present invention, as an object of inhibition of dubbing, one or both of dubbing inhibition in a unit of a program and dubbing information in a unit of a recording medium can be selected in accordance with an actual situation of use or the like.

Further, the dubbing inhibition operation according to the present invention is not executed in normal dubbing at a standard speed so that, for example, copying of a track or a recording medium which is inhibited upon high speed dubbing is permitted upon standard speed dubbing.

Consequently, for example, the convenience in use of a dubbing function to an ordinary user is not deteriorated by the high speed dubbing inhibition function, and protection of the copyright can be achieved by urging a user to perform standard speed dubbing.

Further, according to the present invention, if a user tries to perform dubbing of the same track or the same recording medium within a predetermined time corresponding to the timer time by high speed dubbing and a dubbing inhibition operation for the track or the recording medium is executed, then the timer which corresponds to the track or the recording medium (identification information of the track or the recording medium) is reset and re-starts it time counting from the beginning. This operation is a penalty to the user, and also this operation can suppress the user from using the high speed dubbing function exceeding the range of personal use thereby to achieve protection of the copyright.

What is claimed is:

1. A reproduction apparatus for reproducing a program recorded on a recording medium, comprising:

reproduction means for reproducing a program recorded on the recording medium;

time counting means for starting a time counting operation in response to an operation of said reproduction means;

detection means for detecting identification information for identification of the recording medium or the program;

storage means for storing the identification information detected by said detection means corresponding to said time counting means;

comparison means for comparing the identification information stored in said storage means and the identification information detected by said detection means; and control means for inhibiting, when said comparison means discriminates that the identification information stored in said storage means and the identification information detected by said detection means coincide with each other, the reproduction by said reproduction means of the program corresponding to the identification information until the time counting of said time counting means corresponding to the identification information reaches a predetermined time.

2. A reproduction apparatus according to claim 1, wherein said reproduction means includes readout means for reading out a program recorded on the recording medium, and said control means controls so as to inhibit reading out of the program by said readout means.

3. A reproduction apparatus according to claim 1, wherein said control means controls so as to inhibit reproduction outputting of the program by said reproduction means.

4. A reproduction apparatus according to claim 1, wherein said reproduction means is capable of reproducing the program as a digital signal, and said control means inhibits the reproduction of the digital signal.

5. A reproduction apparatus according to claim 1, wherein said reproduction means is capable of reproducing the program as an analog signal, and said control means inhibits the reproduction of the analog signal.

6. A reproduction apparatus according to claim 1, wherein the identification information is recorded in a predetermined format on the recording medium.

7. A reproduction apparatus according to claim 6, wherein the identification information is included in management information recorded in a management area of the recording medium.

8. A reproduction apparatus according to claim 7, wherein the management information recorded in the management area of the recording medium is copyright information.

9. A reproduction apparatus according to claim 7, wherein the management information recorded in the management area of the recording medium is produced based on the number of programs recorded on the recording medium and recording time.

10. A reproduction apparatus according to claim 6, wherein the identification information is interposed in a predetermined format for each program section in information of a unit of a program recorded on the recording medium.

11. A reproduction apparatus according to claim 1, wherein said control means invalidates the inhibition of the reproduction when the program is reproduced at a predetermined transfer rate by said reproduction means.

12. A reproduction apparatus according to claim 1, wherein said time counting means starts time counting thereof associated with the identification information corresponding to the program from the beginning when the inhibition of the reproduction of the program is canceled by said control means.

13. A recording and reproduction system, comprising:

a reproduction apparatus for reproducing a program recorded on a first recording medium; and a recording apparatus for recording the reproduced program onto a second recording medium;

said reproduction apparatus including reproduction means for reproducing a program recorded on the recording medium, time counting means for starting a time counting operation in response to an operation of said reproduction means, detection means for detecting identification information for identification of the recording medium or the program, storage means for storing the identification information detected by said detection means corresponding to said time counting means, comparison means for comparing the identification information stored in said storage means and the identification information detected by said detection means, and control means for inhibiting, when said comparison means discriminates that the identification information stored in said storage means and the identification information detected by said detection means coincide with each other, the reproduction by said reproduction means of the program corresponding to the identification information until the time counting of said time counting means corresponding to the identification information reaches a predetermined time;

said recording apparatus including inputting means for receiving the program reproduced by said reproduction means, and recording means for recording the program received by said inputting means onto the second recording medium.

14. A recording and reproduction system according to claim 13, wherein said reproduction means includes readout means for reading out a program recorded on the first recording medium, and said control means controls so as to inhibit reading out of the program by said readout means.

15. A recording and reproduction system according to claim 13, wherein said control means controls so as to inhibit reproduction outputting of the program by said reproduction means.

16. A recording and reproduction system according to claim 13, wherein said reproduction means is capable of reproducing the program as a digital signal, and said control means inhibits the reproduction of the digital signal.

17. A recording and reproduction system according to claim 13, wherein said reproduction means is capable of reproducing the program as an analog signal, and said control means inhibits the reproduction of the analog signal.

18. A recording and reproduction system according to claim 13, wherein the identification information is recorded in a predetermined format on the first recording medium.

19. A recording and reproduction system according to claim 18, wherein the identification information is included in management information recorded in a management area of the first recording medium.

20. A recording and reproduction system according to claim 19, wherein the management information recorded in the management area of the first recording medium is copyright information.

21. A recording and reproduction system according to claim 19, wherein the management information recorded in the management area of the first recording medium is produced based on the number of programs recorded on the first recording medium and recording time.

22. A recording and reproduction system according to claim 18, wherein the identification information is interposed in a predetermined format for each program section in information of a unit of a program recorded on the first recording medium.

23. A recording and reproduction system according to claim 13, wherein said control means invalidates the inhibition of the reproduction when the program is reproduced at a predetermined transfer rate by said reproduction means.

24. A recording and reproduction system according to claim 13, wherein said time counting means starts time counting thereof associated with the identification information corresponding to the program from the beginning when the inhibition of the reproduction of the program is canceled by said control means.

25. A reproduction method for reproducing a program recorded on a recording medium, comprising:

a reproduction step of reproducing a program recorded on the recording medium;

a time counting step of starting a time counting operation in response to the reproduction;

a detection step of detecting identification information for identification of the recording medium or the program;

a storage step of storing the identification information detected corresponding to the time counting;

a comparison step of comparing the stored identification information and the detected identification information; and a control step of inhibiting, when it is discriminated in the comparison step that the stored identification information and the detected identification information coincide with each other, the reproduction of the program corresponding to the identification information until the time counting corresponding to the identification information reaches a predetermined time.

26. A recording and reproduction method for reproducing a program recorded on a first recording medium and recording the reproduced program onto a second recording medium, comprising:

a reproduction step of reproducing a program recorded on the first recording medium;

a time counting step of starting a time counting operation in response to the reproduction;

a detection step of detecting identification information for identification of the first recording medium or the program;

a storage step of storing the identification information detected corresponding to the time counting;

a comparison step of comparing the stored identification information and the detected identification information;

a control step of inhibiting, when it is discriminated in the comparison step that the stored identification information and the detected identification information coincide with each other, the reproduction of the program corresponding to the identification information until the time counting corresponding to the identification information reaches a predetermined time;

an inputting step of receiving the reproduced program; and a recording step of recording the received program onto the second recording medium.

* * * * *

UNITED STATES PATENT AND TRADEMARK OFFICE
CERTIFICATE OF CORRECTION

PATENT NO.    : 6,298,022 B1
DATED         : October 2, 2001
INVENTOR(S)   : Junichi Aramaki et al.

It is certified that error appears in the above-identified patent and that said Letters Patent is hereby corrected as shown below:

Column 10,
Line 22, change "coding)" to -- coding --.

Column 14,
Line 57, change "coded" to -- code --.

Column 17,
Line 3, delete the period (first occurrence).

Column 24,
Line 34, change "s" to -- is --.

Column 25,
Line 30, delete "to".

Column 29,
Line 28, delete "is executed" (second occurrence); and
Line 60, after "is" insert -- an --.

Column 30,
Line 64, delete the period (first occurrence).

Column 31,
Line 7, delete "be".

Signed and Sealed this

Thirtieth Day of April, 2002

*Attest:*

*Attesting Officer*

JAMES E. ROGAN
*Director of the United States Patent and Trademark Office*